US008022900B2

(12) United States Patent
Koh et al.

(10) Patent No.: US 8,022,900 B2
(45) Date of Patent: Sep. 20, 2011

(54) OLED DISPLAY

(75) Inventors: Byung-Sik Koh, Gwangmyeong-si (KR); Nam-Deog Kim, Yongin-si (KR); Beohm-Rock Choi, Seoul (KR); Kyeng-Eun Roh, Seongnam-si (KR); Kwang-Chul Jung, Seongnam-si (KR); Joon-Hoo Choi, Seoul (KR); Jong-Moo Huh, Hwasung-si (KR); Seung-Kyu Park, Hwaseong-si (KR); Joon-Chul Goh, Seoul (KR); Young-Soo Yoon, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 735 days.

(21) Appl. No.: 11/561,231

(22) Filed: Nov. 17, 2006

(65) Prior Publication Data
US 2008/0007492 A1 Jan. 10, 2008

(30) Foreign Application Priority Data

Nov. 17, 2005 (KR) .................. 10-2005-0110221
May 30, 2006 (KR) .................. 10-2006-0048615
Jul. 21, 2006 (KR) .................. 10-2006-0068471

(51) Int. Cl.
*G09G 3/30* (2006.01)
(52) U.S. Cl. ............. 345/76; 345/77; 315/505
(58) Field of Classification Search .......... 345/76, 345/77, 92; 349/69; 313/500–512; 315/169.3
See application file for complete search history.

(56) References Cited

U.S. PATENT DOCUMENTS

| 6,522,079 | B1 | 2/2003 | Yamada |
| 6,771,028 | B1* | 8/2004 | Winters ............... 315/169.1 |
| 7,710,022 | B2* | 5/2010 | Cok et al. ............ 313/505 |
| 7,759,676 | B2* | 7/2010 | Song ..................... 257/40 |
| 2002/0186214 | A1 | 12/2002 | Siwinski |
| 2002/0196389 | A1 | 12/2002 | Koyama |
| 2003/0205968 | A1* | 11/2003 | Chae et al. ........... 313/500 |
| 2004/0135173 | A1* | 7/2004 | Choi et al. ............ 257/200 |
| 2004/0251846 | A1* | 12/2004 | Choi et al. ........... 315/169.3 |

(Continued)

FOREIGN PATENT DOCUMENTS

CN 1497513 5/2004

(Continued)

OTHER PUBLICATIONS

English Abstract for Publication No. CN 1551079, publication date Dec. 1, 2004.

(Continued)

*Primary Examiner* — Amare Mengistu
*Assistant Examiner* — Dmitriy Bolotin
(74) *Attorney, Agent, or Firm* — F. Chau & Associates, LLC

(57) ABSTRACT

An OLED display includes a pixel having a first sub-pixel, a second sub-pixel, a third sub-pixel, and a fourth sub-pixel, each of which displays a different color, a gate line for transmitting gate signals to the pixel, a data line for transmitting data signals to the pixel, a first driving voltage line that transmits a driving voltage to the pixel and is substantially parallel to the data line, and a second driving voltage line that is connected to the first driving voltage line and is substantially parallel to the gate line.

37 Claims, 15 Drawing Sheets

U.S. PATENT DOCUMENTS

2005/0116615 A1* 6/2005 Matsumoto et al. .......... 313/500
2005/0140306 A1* 6/2005 Park ........................... 315/169.3
2005/0218792 A1* 10/2005 Jianpu et al. ................. 313/502

FOREIGN PATENT DOCUMENTS

| CN | 1551079 | 12/2004 |
|---|---|---|
| WO | WO 01/37249 | 5/2001 |

OTHER PUBLICATIONS

English Abstract for Publication No. CN 1497513, publication date May 19, 2004.

* cited by examiner

OLED DISPLAY

CROSS-REFERENCE TO RELATED APPLICATION

This application claims priority to and the benefit of Korean Patent Application Nos. 10-2005-0110221, 10-2006-0048615, and 10-2006-0068471 that were respectively filed in the Korean Intellectual Property Office on Nov. 17, 2005, May 30, 2006, and Jul. 21, 2006, the entire contents of which are incorporated herein by reference.

BACKGROUND OF THE INVENTION

1. Technical Field

The present invention relates to a display and in particular, to an organic light emitting diode (OLED) display.

2. Discussion of the Related Art

Recently, the use of liquid crystal display (LCD) has begun to replace cathode ray tube (CRT) technology used in computer monitors, televisions and other display devices. LCD display devices may be lighter and thinner than CRT display devices, however, conventional LCD display devices may require a separate backlight as a light-emitting device and may have a reduced response speed and limited viewing angle when compared with CRT display devices.

Organic light emitting diode (OLED) technology may also be used to produce light and thin display devices. The OLED display may include two electrodes and an emission layer positioned there between. Excitons may be formed in the emission layer by coupling of electrons injected from one electrode and holes that injected from the other electrode. As the excitons are formed, light may be emitted.

The OLED display is therefore self-luminescent and does not require a separate light source as a backlight. OLED displays may also be energy efficient, have high response speeds, wide viewing angles and high contrast ratios. The luminescent layer of the OLED may be made of an organic material that intrinsically emits one of the three additive primary colors, red, green, and blue. A desired image may be displayed by the spatial sum of the additive primary color light generated by the luminescent layer.

As the size of the OLED display is increased, a current consumed to display the same brightness is also increased. However, as the current is increased, a voltage drop may occur. Accordingly, conventional OLED displays may experience reduced uniformity of screen display and crosstalk.

SUMMARY OF THE INVENTION

Embodiments of the present invention may provide an OLED display having improved aperture ratio and yield, and reduced cost of manufacture.

Embodiments may prevent a voltage drop and improve screen uniformity by effectively applying a driving voltage of the OLED display.

An OLED display according to an exemplary embodiment of the present invention may include a pixel including four sub-pixels each displaying different colors, two gate lines for transmitting gate signals to the pixel, two data lines for transmitting data signals to the pixel, and a driving voltage line for transmitting a driving voltage to the pixel.

The four sub-pixels display red, green, blue, and white, respectively, and the sub-pixels may be arranged in a matrix of 2 rows and 2 columns.

One of the two gate lines may transmit the gate signal to sub-pixels of the first row, and the other of the gate lines may transmit the gate signal to sub-pixels of the second row.

The gate signals transmitted by the two gate lines may be the same signal.

One of the two gate lines may be formed in the lower side of sub-pixels of the first row, and the other of the two gate lines may be formed in the lower side of sub-pixels of the second row.

One of the two data lines may transmit the data signal to sub-pixels of the first column, and the other of the two data lines may transmit the data signal to sub-pixels of the second column.

One of the two data lines may be formed in the left side of the sub-pixels of the first column, and the other of the two data lines may be formed in the right side of the sub-pixels of the second column.

The driving voltage line may be formed between the sub-pixels of the first column and the sub-pixels of the second column.

The sub-pixels displaying red, green, and blue, may include a red color filter, a green color filter, and a blue color filter, respectively.

The pixel may further include a pixel electrode connected to the gate line and the data line, a common electrode opposite to the pixel electrode, and a light emitting member disposed between the pixel electrode and the common electrode. The light emitting member may include a plurality of light emitting layers that emit light having different wavelengths, and light having different wavelengths may be combined to emit white light.

The red color filter, the green color filter, and the blue color filter may be respectively spaced apart from the light-emitting member with the pixel electrode interposed there between.

An OLED display according to another embodiment of the present invention may include a pixel including a first sub-pixel, a second sub-pixel, a third sub-pixel, and a fourth sub-pixel, each of which may display a different color, a gate line for transmitting gate signals to the pixel, a data line for transmitting data signals to the pixel, a first driving voltage line that may transmit a driving voltage to the pixel and may be substantially parallel to the data line, and a second driving voltage line that may be connected to the first driving voltage line and may be substantially parallel to the gate line.

The first driving voltage line may be formed using the same material as that of the data line.

The second driving voltage line may be formed using the same material as that of the gate line.

The first driving voltage line and the second driving voltage line may be connected directly through a contact hole.

The first driving voltage line and the second driving voltage line may be connected through a connecting member.

The connecting member may include indium-tin oxide (ITO) or indium-zinc oxide (IZO).

The first driving voltage line may cross the center of the pixel.

The second driving voltage line may cross the center of the pixel.

The first to fourth sub-pixels may display red, green, blue, and white, respectively.

The first to third sub-pixels may include a red color filter, a green color filter, and a blue color filter, respectively.

The pixel may further include a pixel electrode connected to the gate line and the data line, a common electrode opposite to the pixel electrode, and a light emitting member disposed between the pixel electrode and the common electrode. The light emitting member may include a plurality of light emitting layers that emit light having different wavelengths, and light having different wavelengths may be combined to emit white light.

The red color filter, the green color filter, and the blue color filter may be respectively spaced apart from the light-emitting member with the pixel electrode interposed there between.

The first and second sub-pixels may be symmetrical to each other about the first driving voltage line, and the third and fourth sub-pixels may be symmetrical to each other about the first driving voltage line.

The first and third sub-pixels may be symmetrical to each other about the second driving voltage line, and the second and fourth sub-pixels may be symmetrical to each other about the second driving voltage line.

The gate line may include a first gate line for transmitting a gate voltage to the first and second sub-pixels, and a second gate line for transmitting a gate voltage to the third and fourth sub-pixels.

The gate line may include a first gate line for transmitting a gate voltage to the first and third sub-pixels, and a second gate line for transmitting a gate voltage to the second and fourth sub-pixels.

An OLED display according to yet another embodiment of the present invention may include a pixel including a first sub-pixel, a second sub-pixel, a third sub-pixel, and a fourth sub-pixel, which may each display different colors. The OLED display may include a substrate, a light-blocking member formed on the substrate and having a plurality of openings, a gate line formed on the substrate for transmitting a gate signal to the pixel, a data line crossing the gate line for transmitting a data signal to the pixel, and a driving voltage line electrically connected to the light-blocking member for transmitting a driving voltage to the pixel.

The light-blocking member may be applied with the driving voltage.

The light-blocking member may be made of metal.

The OLED display may further include an organic light-emitting member covering the openings of the light-blocking member.

The OLED display may further include a first insulating layer formed between the light-blocking member and the gate line.

The first to fourth sub-pixels may display red, green, blue, and white, respectively.

The first to third sub-pixels may include a red color filter, a green color filter, and a blue color filter, respectively.

The pixel may further include a pixel electrode connected to the gate line and the data line, a common electrode opposite to the pixel electrode, and a light emitting member disposed between the pixel electrode and the common electrode. The light emitting member may include a plurality of light emitting layers that emit light having different wavelengths, and light having different wavelengths may be combined to emit white light.

The red color filter, the green color filter, and the blue color filter may be respectively spaced apart from the light-emitting member with the pixel electrode interposed there between.

The opening may be square.

BRIEF DESCRIPTION OF THE DRAWINGS

A more complete appreciation of the present disclosure will be readily obtained as the same becomes better understood by reference to the following detailed description when considered in connection with the accompanying drawings, wherein.

DETAILED DESCRIPTION OF THE EMBODIMENTS

Figure 1:
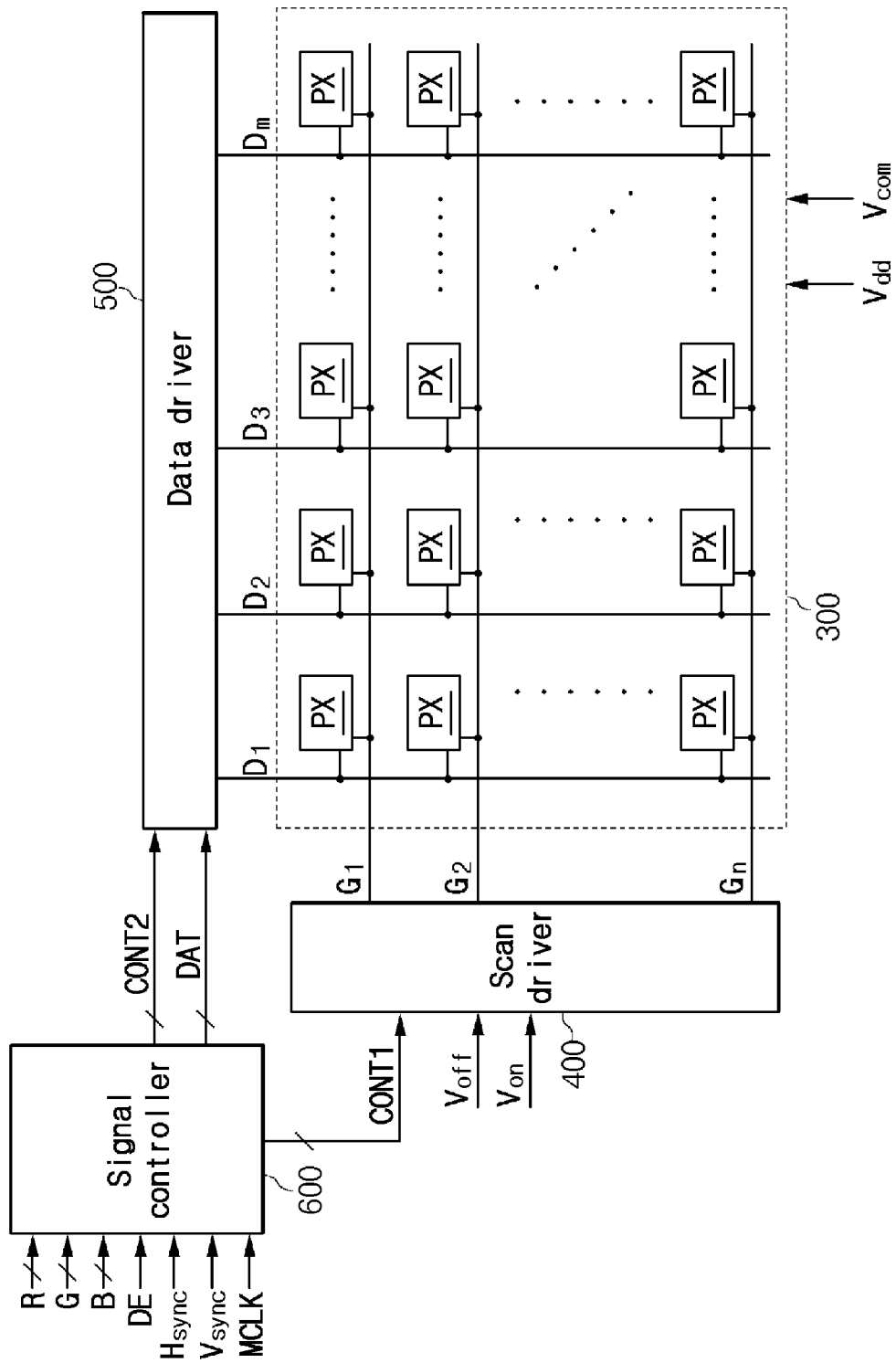
FIG. 1 is a block diagram of an OLED display according to an embodiment of the present invention.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A display apparatus and a driving method thereof according to embodiments of the present invention will now be described in detail with reference to the accompanying drawings.

Figure 2:
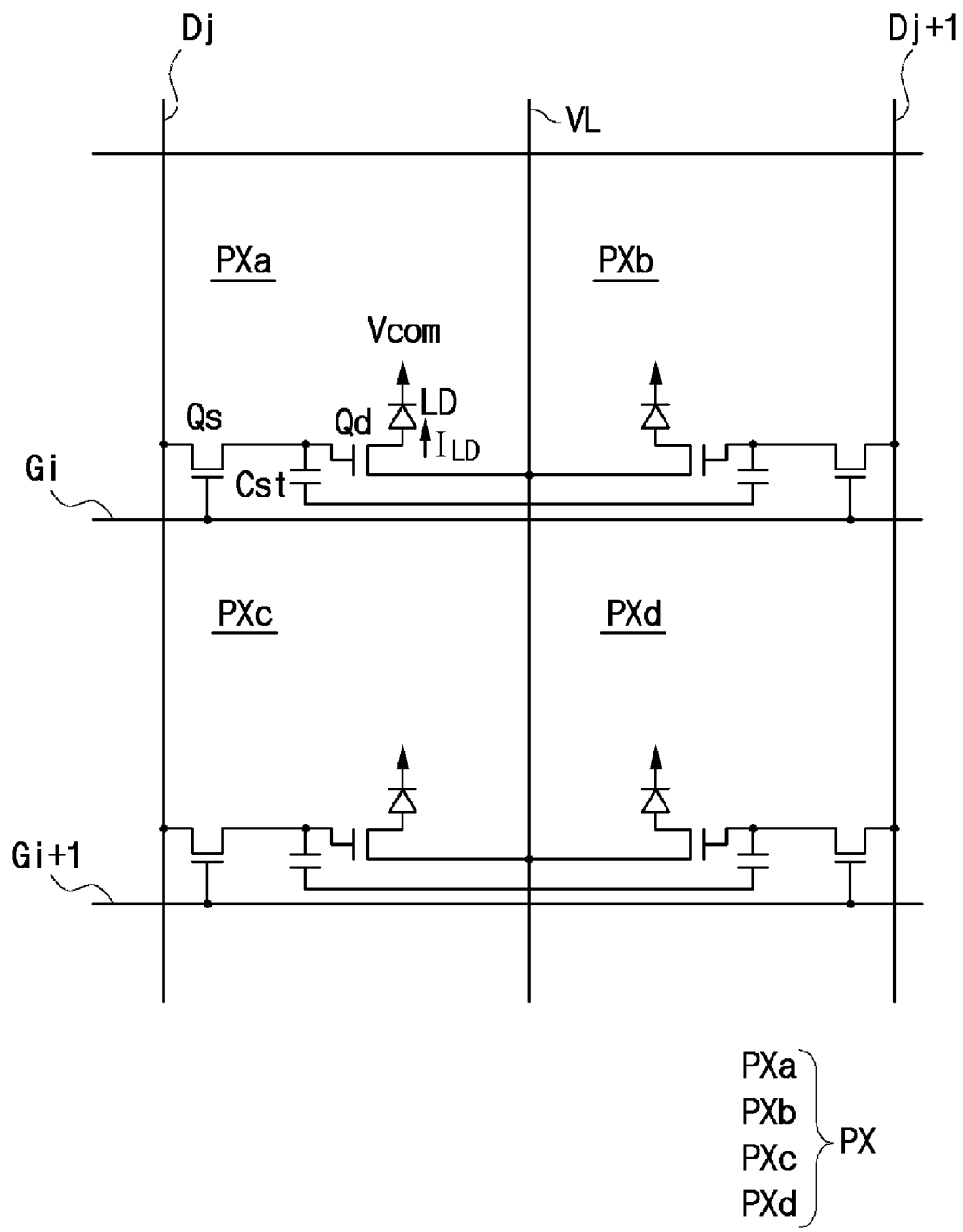
FIG. 2 is an equivalent circuit diagram of an OLED display according to an embodiment of the present invention.

FIG. 1 is a block diagram of an OLED display according to an embodiment of the present invention, and FIG. 2 is an equivalent circuit diagram of one pixel of the OLED display according to an embodiment of the present invention.

As shown in FIG. 1, the OLED display according to an embodiment of the present invention may include a display panel 300, a scanning driver 400 and a data driver 500 connected to the display panel 300, and a signal controller 600 that may control the display panel 300, the scanning driver 400, and the data driver 500.

The display panel 300 may include a plurality of display signal lines $G_1$ to $G_n$ and $D_1$ to $D_m$, a plurality of driving voltage lines (not shown), and a plurality of pixels PX connected to the display signal lines $G_1$ to $G_n$ and $D_1$ to $D_m$ and the driving voltage lines, and arranged substantially in a matrix, when viewing it as an equivalent circuit.

The display signal lines $G_1$ to $G_n$ and $D_1$ to $D_m$ may include a plurality of scanning signal lines $G_1$ to $G_n$ for transmitting a scanning signal, and a plurality of data lines $D_1$ to $D_m$ for transmitting a data voltage. The scanning signal lines $G_1$ to $G_n$ may extend substantially in a row direction, and they may be spaced apart from each other and may be parallel or almost parallel to each other. The data lines $D_1$ to $D_m$ may extend substantially in a column direction, and they may be spaced apart from each other and may be parallel or almost parallel to each other.

The driving voltage lines may transmit a driving voltage Vdd to each pixel PX.

As shown in FIG. 2, each pixel PX may include a plurality of sub-pixels PXa, PXb, PXc, and PXd arranged in a matrix form. Each of the respective sub-pixels PXa, PXb, PXc, and PXd may display any one of red, green, blue, and white such that each color is represented by one sub-pixel. The sub-pixels PXa, PXb, PXc, and PXd may be arranged in 2×2 matrix form, thus forming one pixel PX.

The OLED display according to an embodiment may include upper and lower scanning signal lines $G_i$ and $G_{i+1}$, left and right data lines $D_j$ and $D_{j+1}$, and driving voltage lines VL. The scanning signal lines $G_i$ and $G_{i+1}$ may extend substantially in a row direction and may be parallel to each other. The data lines $D_j$ and $D_{j+1}$ may extend substantially in a column direction and may be parallel to each other. The driving voltage line VL may extend in parallel to the data lines $D_j$ and $D_{j+1}$.

The upper scanning signal line $G_i$ may pass under the first and second sub-pixels PXa and PXb, and may transmit a gate signal to the first and second sub-pixels PXa and PXb. The lower scanning signal line $G_{i+1}$ may pass under the third and fourth sub-pixels PXc and PXd, and may transmit a gate signal to the third and fourth sub-pixels PXc and PXd.

The left data line $D_j$ may pass by the left of the first and third sub-pixels PXa and PXc, and may transmit a data signal to the first and third sub-pixels PXa and PXc. The right data line $D_{j+1}$ may pass by the right of the second and fourth sub-pixels PXb and PXd, and may transmit a data signal to the second and fourth sub-pixels PXb and PXd.

The driving voltage line VL may transmit a driving voltage to the first to fourth sub-pixels PXa, PXb, PXc, and PXd and may pass between the first and third sub-pixels PXa and PXc and the second and fourth sub-pixels PXb and PXd. The driving voltage VL may include a plurality of sub-lines or nodes VLa, VLb, VLc, and VLd (not shown) corresponding to each sub-pixel PXa, PXb, PXc, and PXd respectively.

Each of the sub-pixels PXa, PXb, PXc, and PXd, for example, the sub-pixel PXa connected to the scanning signal line $G_i$ and the data line $D_j$, may include an OLED (LD), a driving transistor Qd, a storage capacitor Cst, and a switching transistor Qs.

The driving transistor Qd may be a three-terminal element. The driving transistor Qd may have a control terminal connected to the switching transistor Qs and the storage capacitor Cst, an input terminal connected to the driving voltage line VLa, and an output terminal connected to the OLED (LD).

The switching transistor Qs may also be a three-terminal element. The switching transistor Qs may have a control terminal and an input terminal connected to the scanning signal line $G_i$ and the data line $D_j$, respectively, and an output terminal connected to the storage capacitor Cst and the driving transistor Qd.

The storage capacitor Cst may be connected between the switching transistor Qs and the driving voltage line VLa, and may be charged with the data voltage from the switching transistor Qs that is then retained for a predetermined time.

The OLED (LD) may have two electrodes comprising an anode and a cathode respectively connected to the driving transistor Qd and a common voltage Vcom. The OLED (LD) may emit light by changing the intensity thereof depending on an amount of a current $I_{LD}$ output from the driving transistor Qd, whereby an image may be displayed. An amount of the current $I_{LD}$ may depend on an amount of a voltage Vgs between the control terminal and the output terminal of the driving transistor Qd.

The switching and driving transistors Qs and Qd may include an n-channel field effect transistor (FET) made of amorphous silicon or polycrystalline silicon. However, the transistors Qs and Qd may include a p-channel FET. In this case, the p-channel FET and the n-channel FET may be complementary, in this case, operation, voltage, and current of the p-channel FET may be opposite to those of the n-channel FET.

A detailed construction of the OLED display shown in FIG. 2 will be described in detail with reference to FIGS. 3 to 5.

Figure 3:
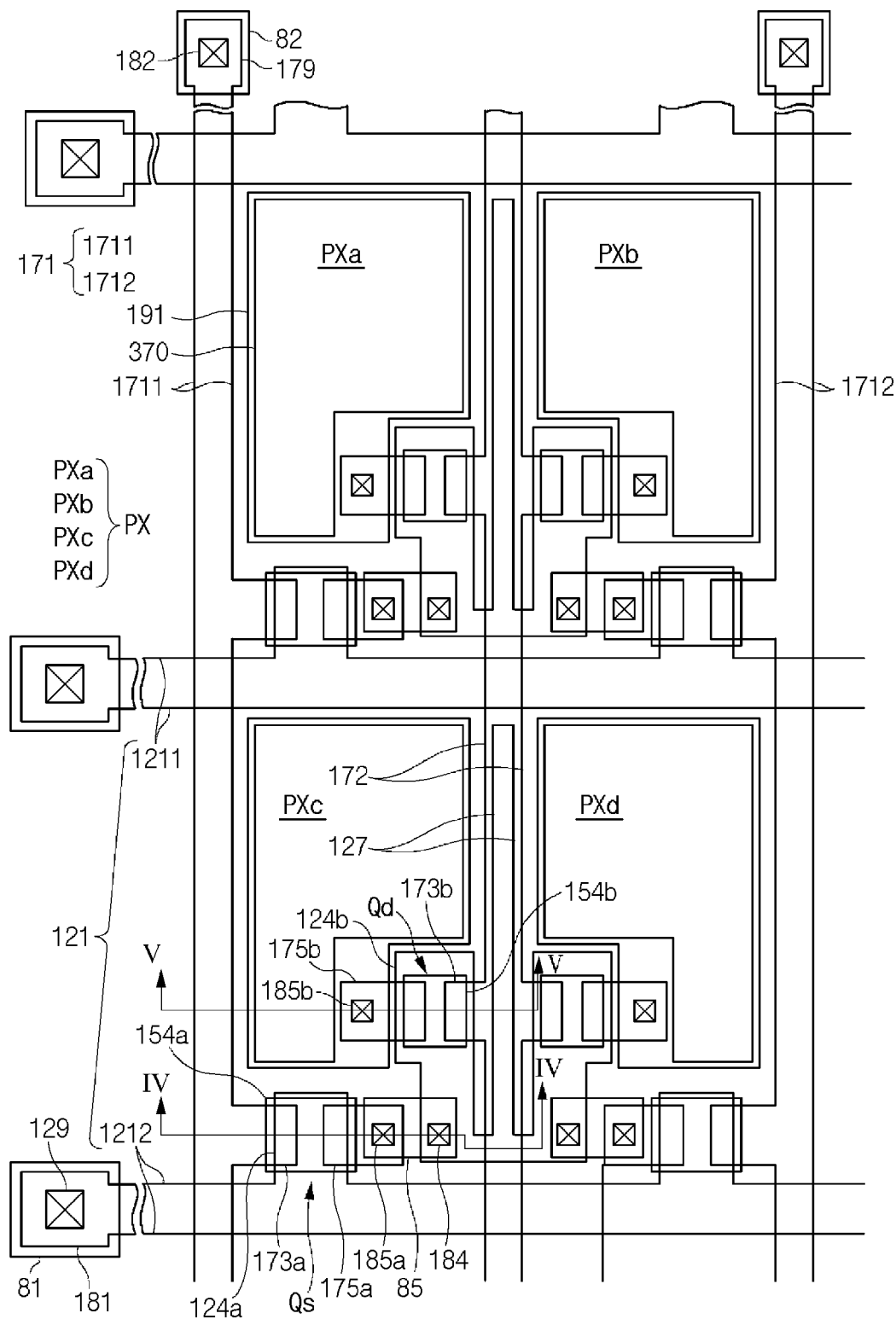
FIG. 3 is a layout diagram of an OLED display according to an embodiment of the present invention.

FIG. 3 is a layout diagram of the OLED display according to an embodiment of the present invention. FIGS. 4 and 5 are cross-sectional views of the OLED display of FIG. 3, which are respectively taken along lines IV-IV and V-V.

Figure 4:
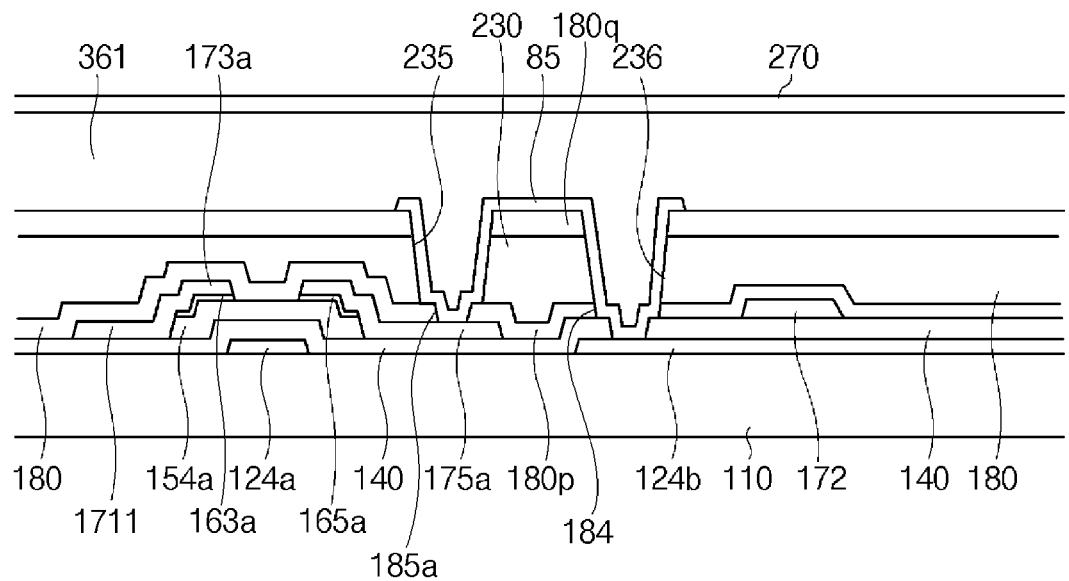
FIGS. 4 and 5 are cross-sectional views of the OLED display of FIG. 3, which are respectively taken along lines IV-IV and V-V.
Figure 5:
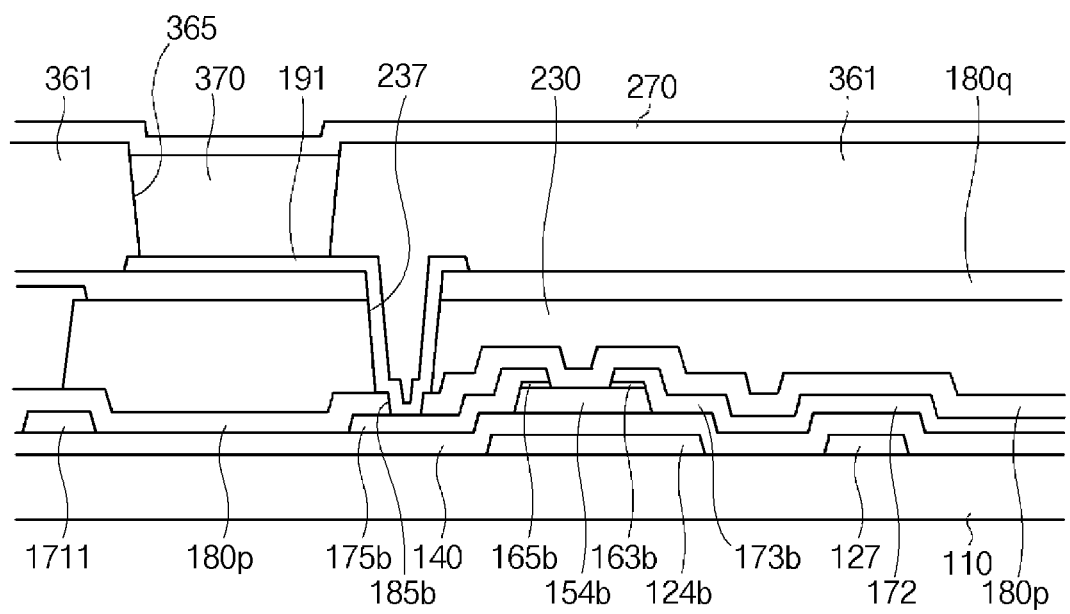

Referring to FIGS. 3, 4 and 5, the OLED display may include one pixel comprising the first, second, third, and fourth sub-pixels PXa, PXb, PXc, and PXd arranged in 2×2 matrix form.

A plurality of gate conductors that include a plurality of gate lines 121 including first control electrodes 124a and a plurality of second control electrodes 124b are formed on an insulating substrate 110 such as transparent glass or plastic.

Each of the gate lines 121 may include upper and lower gate lines 1211 and 1212 respectively and may largely extend in a transverse direction. The upper and lower gate lines 1211 and 1212 may be disposed on upper and lower sides with the first to fourth sub-pixels PXa, PXb, PXc, and PXd there between. The gate line 121 may include an end portion 129 having a large area for connection to other layers or an external driving circuit, and the first control electrode 124a may extend to the upper side or lower side from the gate lines 121. The gate lines 121 may extend to be directly connected to a gate driving circuit (not shown) for generating the gate signals, which may be integrated on the substrate 110.

The second control electrode 124b may include a storage electrode 127 that may be separated from the gate lines 121 and may extend in a downward direction, change direction to the right side, and then extend long to the upward direction.

The gate conductors 121 and 124b may be made of aluminum metals such as aluminum (Al) or an aluminum alloy, silver metals such as silver (Ag) or a silver alloy, copper metals such as copper (Cu) or a copper alloy, molybdenum metals such as molybdenum (Mo) or a molybdenum alloy, chromium (Cr), thallium (Ta), titanium (Ti), or another metal or metal alloy. However, they may have a multi-layer structure including two conductive layers (not shown) that may have different physical properties. One conductor layer among them may be made of metals having low resistivity, for example aluminum metals, silver metals, copper metals, etc., in order to reduce signal delay or voltage drop. Alternatively, the other conductor layer may be made of materials, for example molybdenum metals, chromium (Cr), thallium (Ta), titanium (Ti), etc., having excellent physical, chemical, and/or electrical contact characteristics with other materials, particularly with ITO (indium tin oxide) and IZO (indium zinc oxide). A good example of such a combination may include a chromium lower layer and an aluminum (alloy) upper layer, and an aluminum (alloy) lower layer and a molybdenum (alloy) upper layer. However, the gate conductors 121 and 124b may be made of other various metals or conductors.

The lateral sides of the gate conductors 121 and 124b may be inclined to a surface of the substrate 110, and an inclination angle thereof may be about 30° to 80°.

A gate-insulating layer 140, which may be made, for example, of silicon nitride (SiNx), silicon oxide (SiOx), or other materials known to have similar properties, may be formed on the gate conductors 121 and 124b.

A plurality of first and second semiconductor islands 154a and 154b, which may be made of hydrogenated amorphous silicon (a-Si), polysilicon, or other materials known to have similar properties, may be formed on the gate-insulating layer 140. The first and second semiconductors 154a and 154b may be positioned on the first and second control electrodes 124a and 124b, respectively.

A plurality of pairs of first ohmic contacts 163a and 165a and a plurality of pairs of second ohmic contacts 163b and 165b may be formed on the first and second semiconductors 154a and 154b, respectively. The ohmic contacts 163a, 163b, 165a, and 165b may have an island shape and may be made of a material such as n+ hydrogenated amorphous silicon in which an n-type impurity such as phosphor is doped with high concentration, or silicide. The first ohmic contacts 163a and 165a may be formed in pairs and may be disposed on the first semiconductor 154a, and the second ohmic contacts 163b and 165b may also be formed in pairs and may be disposed on the second semiconductor 154b.

A plurality of data conductors including a plurality of data lines 171, a plurality of driving voltage lines 172, and a plurality of first and second output electrodes 175a and 175b may be formed on the ohmic contacts 163a, 163b, 165a, and 165b and the gate insulating layer 140.

Each of the data lines 171 may include first and second data lines 1711 and 1712. The data lines 171 may largely extend in a longitudinal direction and intersect the gate lines 121. The first and second data lines 1711 and 1712 may be disposed on the left and right sides with the first to fourth sub-pixels PXa, PXb, PXc, and PXd there between.

Each of the data lines 171 may includes an end portion 179 having a large area for connection to a plurality of first input electrodes 173a, which may extend toward the first control electrode 124a, to other layers, or to an external driving circuit. The data lines 171 may extend to be directly connected to a data driving circuit (not shown) for generating the data signals, which may be integrated on the substrate 110.

The driving voltage lines 172 may bisect the pixel (PX) and may extend substantially in parallel to the data lines 171. Each of the driving voltage lines 172 may include a plurality of second input electrodes 173b that may extend toward the second control electrode 124b. The driving voltage lines 172 may be overlapped with the storage electrode 127 and may be connected to each other.

The first and second output electrodes 175a and 175b may be separated from each other and may also be separated from the data lines 171 and the driving voltage line 172. The first input electrode 173a and the first output electrode 175a may be opposite to each other with respect to the first control electrode 124a, and the second input electrode 173b and the second output electrode 175b may be opposite to each other with respect to the second control electrode 124b.

As described above, two data lines 1711 and 1712 and one driving voltage line 172 may be formed in one pixel including four sub-pixels. Accordingly, the aperture ratio of the OLED display may be improved according to an embodiment of the present invention. For example, four data lines need not go past one pixel including four sub-pixels, but two data lines 1711 and 1712 may go past one pixel including four sub-pixels. Accordingly, since an area occupied by the data lines in one pixel may be reduced, the aperture ratio can be improved. Furthermore, two driving voltage lines need not go past one pixel including four sub-pixels, but one driving voltage line 172 may go past one pixel including four sub-pixels. Accordingly, since an area occupied by the driving voltage lines in one pixel may be reduced, the aperture ratio can be improved.

Furthermore, since the number of the data lines 1711 and 1712 that go past one pixel may be minimized, the number of data driving integrated circuits can be reduced. Accordingly, manufacturing costs may be saved. Although the number of gate driving integrated circuits may be increased, this may not increase overall manufacturing costs because the manufacturing cost of the gate driving integrated circuits may be cheaper than that of the data driving integrated circuits.

Furthermore, since the number of data lines 1711 and 1712 and driving voltage lines 172 going past one pixel may be reduced, a frequency in which a short circuit problem may occur between the data lines and the driving voltage lines is minimized. Accordingly, production yield may be improved.

The data conductors 171, 172, 175a, and 175b may be made of refractory metals such as molybdenum, chromium, thallium, and titanium, or their alloys. They may have a multi-layered structure including a refractory metal layer (not shown) and a low resistance conductive layer (not shown). An example of the multi-layered structure includes a dual layer of a chromium or molybdenum (or Mo alloy) lower layer and an aluminum (or Al alloy) upper layer, and a triple layer of a molybdenum (or Mo alloy) lower layer, an aluminum (or Al alloy) intermediate layer, and a molybdenum (or Mo alloy) upper layer. However, the data conductors 171, 172, 175a, and 175b may be made of various other metals or conductors.

Like the gate conductors 121 and 124b, the data conductors 171, 172, 175a and 175b may have inclined edge profiles, and the inclination angles thereof may be within the range of about 30-80 degrees.

The ohmic contacts 163a, 163b, 165a, and 165b may be interposed exclusively between the semiconductors 154a and 154b in a lower part thereof and the data conductors 171, 172, 175a, and 175b in an upper part thereof, and contact resistance there between may be reduced. The semiconductors 154a and 154b may have exposed portions that are not covered with the data conductors 171, 172, 175a, and 175b, as is an area between the input electrodes 173a and 173b and the output electrodes 175a and 175b.

A passivation layer 180p may be formed on the data conductors 171, 172, 175a, and 175b and the exposed portion of the semiconductor 154a and 154b. The passivation layer 180p may be made of an inorganic insulator such as silicon nitride or silicon oxide, an organic insulator, a low dielectric constant insulator, or an insulator with similar properties. The organic insulator and the low dielectric insulator may have a dielectric constant of 4.0 or less. For example, the low dielectric insulator may include a-Si:C:O and a-Si:O:F that are formed with plasma enhanced chemical vapor deposition (PECVD), or the like. The passivation layer 180p may be made of an organic insulator with photosensitivity among organic insulators, and a surface thereof may be flat. However, the passivation layer 180p may have a dual-layer structure of a lower inorganic layer and an upper organic layer so as not to cause damage to the exposed portions of the semiconductors 154a and 154b while maintaining the excellent insulating characteristics of the organic layer.

A plurality of contact holes 182, 185a, and 185b for exposing each of the end part 179 of the data line 171 and the first and second output electrodes 175a and 175b may be formed in the passivation layer 180p. A plurality of contact holes 181 and 184 for exposing each of the end part 129 of the gate line 121 and the second input electrode 124b may be formed in the passivation layer 180p and the gate insulating layer 140.

A plurality of color filters 230 may be formed on the passivation layer 180p. The color filters 230 may extend long in a longitudinal direction in a stripe form along the columns of pixel electrodes 191. Two neighboring color filters 230 may overlap with each other on a top surface of the data lines 171. The color filters 230 that are overlapped with each other may be made of an organic layer and provide insulation between the pixel electrodes 191 and the data lines 171. Furthermore, the color filters 230 may serve as a light-blocking member for precluding light from escaping between the pixel electrodes 191. In this case, a light-blocking member on a common electrode display panel can optionally be omitted, thereby simplifying the process.

Through-holes 235, 236, and 237 through which the contact holes 185a, 185b, and 184 may pass may be formed in the color filter 230. The through-holes 235, 236, and 237 may be larger than the contact holes 185a, 185b, and 184. The color filters 230 need not exist in a peripheral region in which the end part 129 of the gate line 121 and the end part 179 of the data line 171 are located.

Each of the color filters 230 may display any one of the three additive primary colors, red, green, and blue. That is, a color filter for displaying the red may be included in a red pixel, a color filter for displaying the green may be included in a green pixel, and a color filter for displaying the blue may be included in a blue pixel.

A color filter need not be included in a white pixel.

An overcoat 180q may be formed on the color filters 230. The overcoat 180q may be made of an organic insulator, and may prevent the color filters 230 from being exposed. The overcoat may also provide a flat surface. The overcoat 180q may be omitted.

A plurality of pixel electrodes 191, a plurality of connecting members 85, and a plurality of contact assistants 81 and 82 may be formed on the overcoat 180q. They may be made of a transparent conductive material such as ITO or IZO, and/or a reflective metal such as aluminum, silver, or their alloys.

The pixel electrode 191 may be physically and electrically connected to the second output electrode 175b through the contact hole 185b. The connecting member 85 may be connected to the second control electrode 124b and the first output electrode 175a through the contact holes 184 and 185a.

The contact assistants 81 and 82 may be connected to the end part 129 of the gate line 121 and the end part 179 of the data line 171 through the contact holes 181 and 182, respectively. The contact assistants 81 and 82 may supplement adhesion between the end portions 129 of the gate line 121 and the end portions 179 of the data line 171, and an external apparatus, and protect them.

A partition 361 may be formed on the overcoat 180q. The partition 361 may define an opening 365 by surrounding the edge of the pixel electrode 191 like a bank, and is made of an organic insulator or an inorganic insulator. The partition 361 may be made of photosensitive material, for example, containing black pigment so that the partition 361 may serve as a light blocking member and the formation of the partition 361 may be simplified.

An organic light-emitting member 370 may be formed within the opening 365 on the pixel electrode 191 that is defined by the partition 361. The organic light-emitting member 370 may be made of an organic material that inherently emits any one of the three additive primary colors red, green, and blue. The OLED display may display a desired image by spatially adding the monochromatic additive primary color lights emitted from the light emitting members 370.

The organic light emitting members 370 may have a multilayered structure including an emission layer (not shown) for emitting light and an auxiliary layer (not shown) for improving light emitting efficiency of the emitting layer. The auxiliary layer may include an electron transport layer (not shown) and a hole transport layer (not shown) for adjusting the balance of electrons and holes, and an electron-injecting layer (not shown) and a hole-injecting layer (not shown) for enhancing the injection of electrons and holes.

A common electrode 270 may be formed on the organic light-emitting member 370. The common electrode 270 may be applied with a common voltage Vss, and may be made of a reflective metal such as calcium (Ca), barium (Ba), magnesium (Mg), aluminum (Al), silver (Ag), or metal with similar reflective properties, or a transparent conductive material such as ITO or IZO.

In the OLED display, a first control electrode 124a connected to the gate line 121, a first input electrode 173a and a first output electrode 175a connected to the data line 171, and a first semiconductor 154a may constitute a switching TFT Qs. A channel of the switching TFT Qs may be formed in the first semiconductor 154a between the first input electrode 173a and the first output electrode 175a. A second control electrode 124b connected to the first output electrode 175a, a second input electrode 173b connected to the driving voltage line 172, a second output electrode 175b connected to the pixel electrode 191, and a second semiconductor 154b may constitute a driving TFT Qd. A channel of the driving TFT Qd may be formed in the second semiconductor 154b between the second input electrode 173b and the second output electrode 175b. The pixel electrode 191, the organic light emitting member 370, and the common electrode 270 may constitute an OLED LD. The pixel electrode 191 may be an anode and the common electrode 270 may be a cathode, or the pixel electrode 191 may be a cathode and the common electrode 270 may be an anode. The storage electrode 127 and the driving voltage line 172 that may overlap with each other may constitute a storage capacitor Cst.

The OLED display constructed as above may send light to the upper side or the lower side of the substrate 110 to display an image. The opaque pixel electrode 191 and the transparent common electrode 270 may be applied to a top emission type of OLED display that displays an image in an upward direction of the substrate 110, and the transparent pixel electrode 191 and the opaque common electrode 270 are applied to a bottom emission type of OLED display that displays an image in a downward direction of the substrate 110.

On the other hand, in the case where the semiconductors 154a and 154b are made of polysilicon, they may include an intrinsic region (not shown) that is opposite to the control electrodes 124a and 124b and an extrinsic region (not shown) that is positioned at both sides thereof. The extrinsic region may be electrically connected to the input electrodes 173a and 173b and the output electrodes 175a and 175b. The ohmic contacts 163a, 163b, 165a, and 165b may be omitted.

Furthermore, the control electrodes 124a and 124b may be put on the semiconductors 154a and 154b, and at this time, the gate insulating layer 140 may be positioned between the semiconductors 154a and 154b and the control electrodes 124a and 124b. At this time, the data conductors 171, 172, 173b, and 175b may be positioned on the gate-insulating layer 140 and may be electrically connected to the semiconductors 154a and 154b through the contact hole (not shown) that may be formed in the gate-insulating layer 140. Alternatively, the data conductors 171, 172, 173b, and 175b may be positioned under the semiconductors 154a and 154b to come into electrical contact with the upper semiconductors 154a and 154b.

The OLED display according to another embodiment of the present invention will be described in detail with reference to FIGS. 6 to 10.

Figure 6:
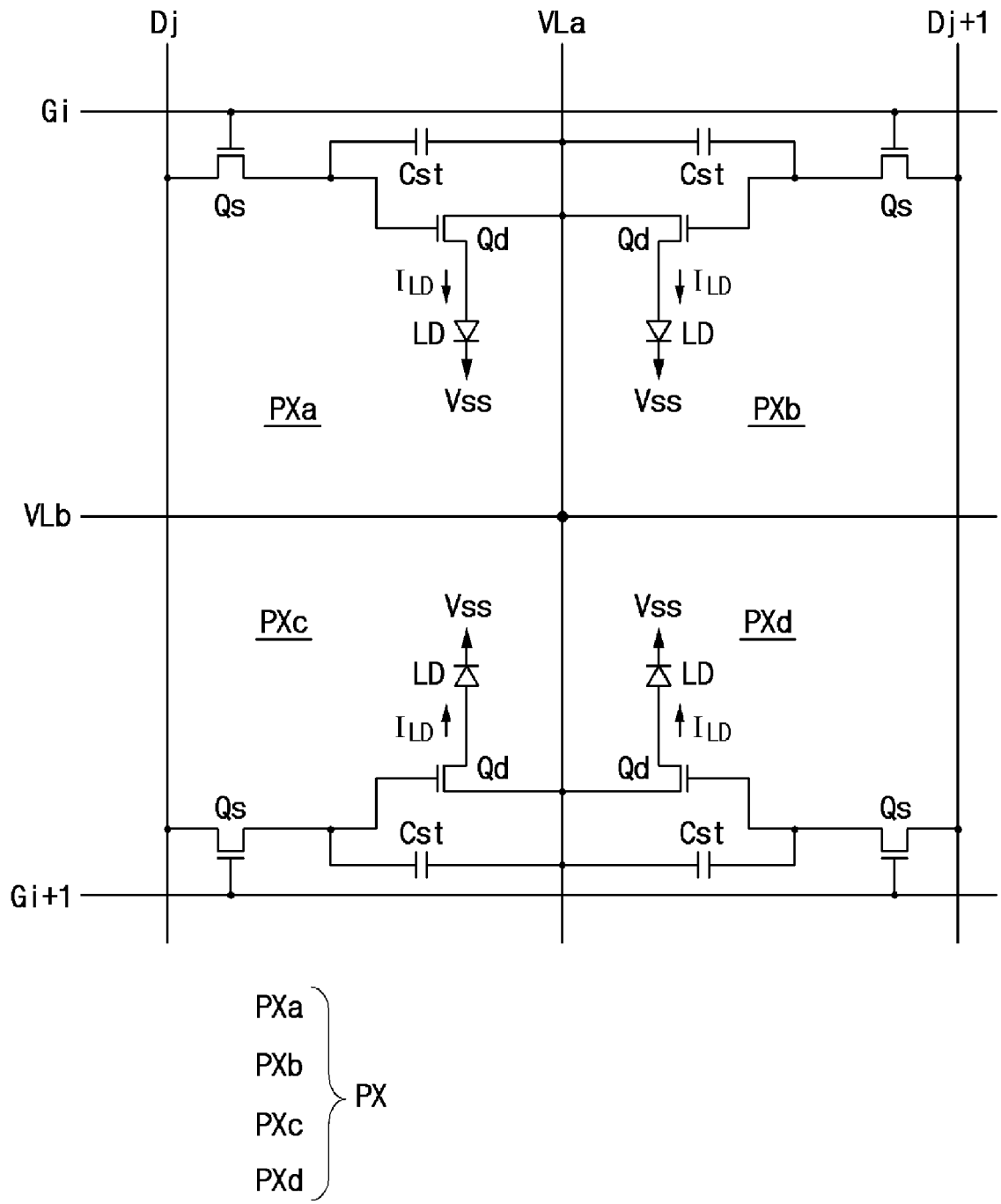
FIG. 6 is an equivalent circuit diagram of an OLED display according to another embodiment of the present invention.

FIG. 6 is an equivalent circuit diagram of an OLED display according to another embodiment of the present invention.

Referring to FIG. 6, each pixel PX may include a plurality of sub-pixels PXa, PXb, PXc, and PXd arranged in a matrix form. Each of the respective sub-pixels PXa, PXb, PXc, and PXd may display any one of red, green, blue, and white. The sub-pixels PXa, PXb, PXc, and PXd may be arranged in a 2×2 matrix form, thus forming one pixel PX.

One pixel PX may include and upper and lower scanning signal lines $G_i$ and $G_{i+1}$ respectively, left and right data lines $D_j$ and $D_{j+1}$ respectively, and first and second driving voltage lines VLa and VLb respectively. The scanning signal lines $G_i$ and $G_{i+1}$ may extend substantially in a row direction and may be parallel to each other. The data lines $D_j$ and $D_{j+1}$ may extend substantially in a column direction and may be parallel to each other. The first driving voltage line VLa may extend in parallel to the data lines $D_j$ and $D_{j+1}$. The second driving voltage line VLb may extend in parallel to the scanning signal lines $G_i$ and $G_{i+1}$. The two driving voltage lines VLa and VLb may intersect each other and may be connected to each other at the intersection.

The upper scanning signal line $G_i$ may transmit a gate signal to the first and second sub-pixels PXa and PXb. The lower scanning signal line $G_{i+1}$ may transmit the gate signal to the third and fourth sub-pixels PXc and PXd. The left data line $D_j$ may transmit a data signal to the first and third sub-pixels PXa and PXc. The right data line $D_{j+1}$ may transmit the data signal to the second and fourth sub-pixels PXb and PXd. The first and second driving voltage lines VLa and VLb may transmit a driving voltage to the first to fourth sub-pixels PXa, PXb, PXc, and PXd.

Each of the sub-pixels PXa, PXb, PXc, and PXd, for example the sub-pixel PXa connected to the scanning signal line $G_i$ and the data line $D_j$ may include an OLED LD, a driving transistor Qd, a storage capacitor Cst, and a switching transistor Qs.

The driving transistor Qd, the switching transistor Qs, and the storage capacitor Cst may be the same as those of the OLED LD that has been described above. Accordingly, they will not be described in detail.

An example of the OLED display shown in FIG. 6 will be described in detail below with reference to FIGS. 7 to 10.

Figure 7:
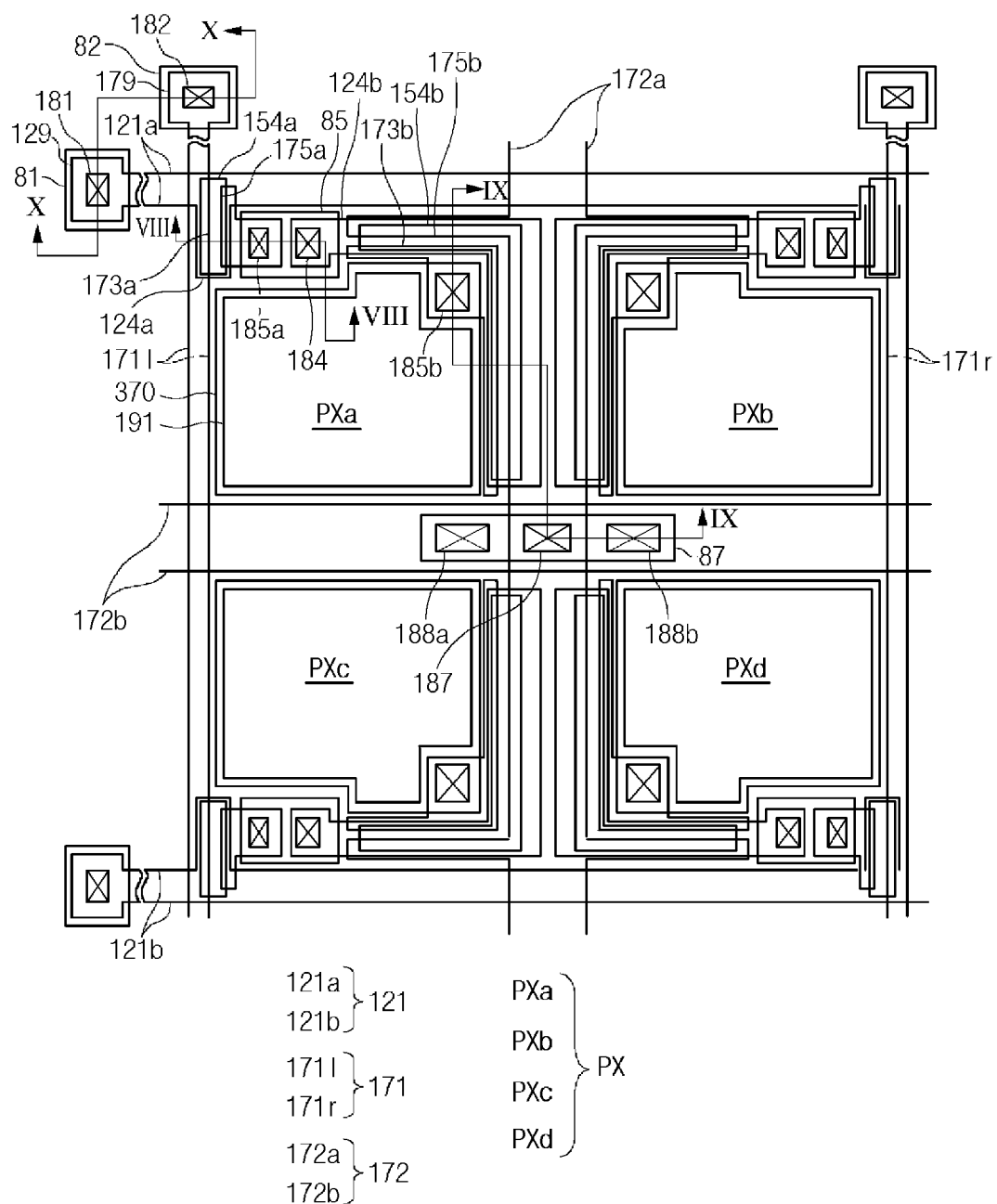
FIG. 7 is a layout diagram of an OLED display according to another embodiment of the present invention.
Figure 8:
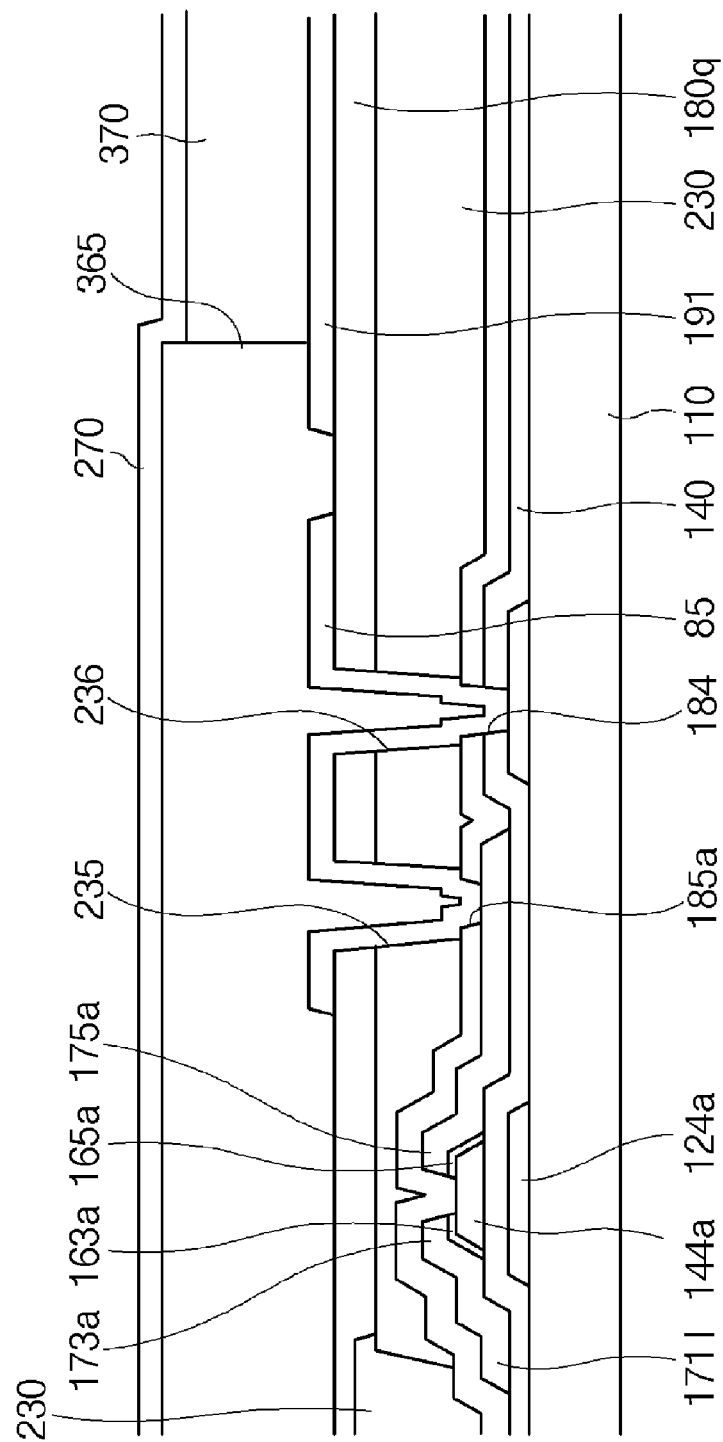
FIGS. 8, 9, and 10 are cross-sectional views of the OLED display shown in FIG. 7, which are taken along lines VIII-VIII, IX-IX, and X-X, respectively.
Figure 9:
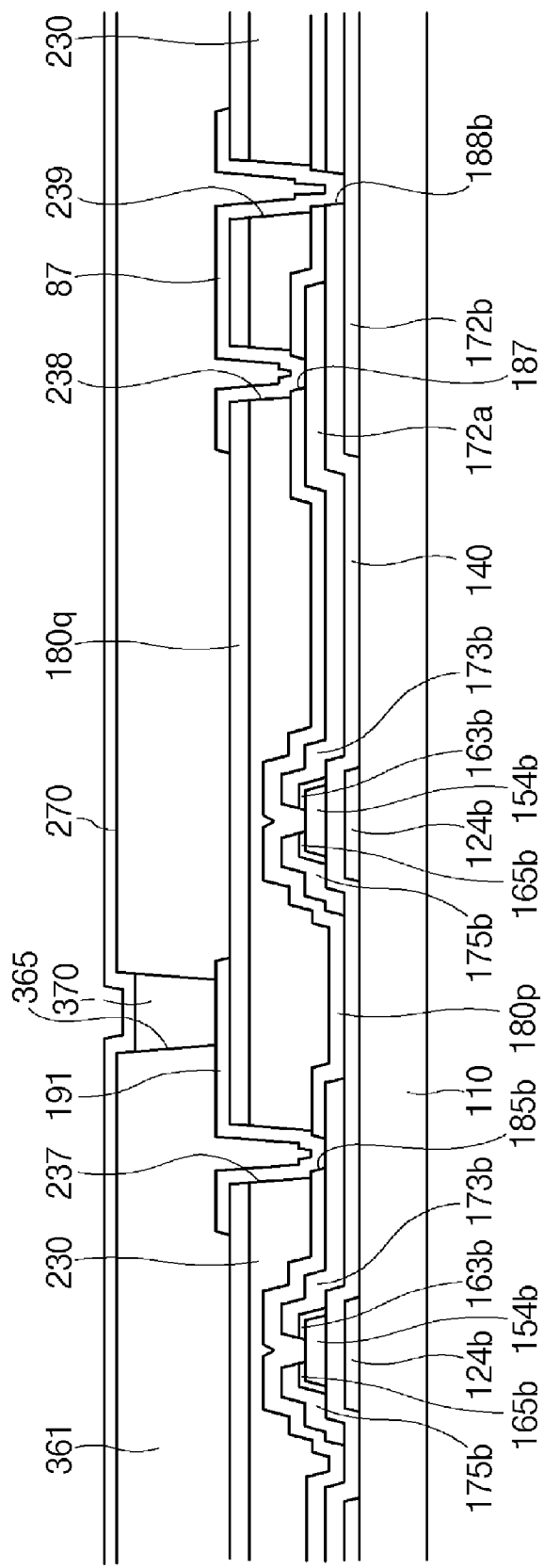
Figure 10:
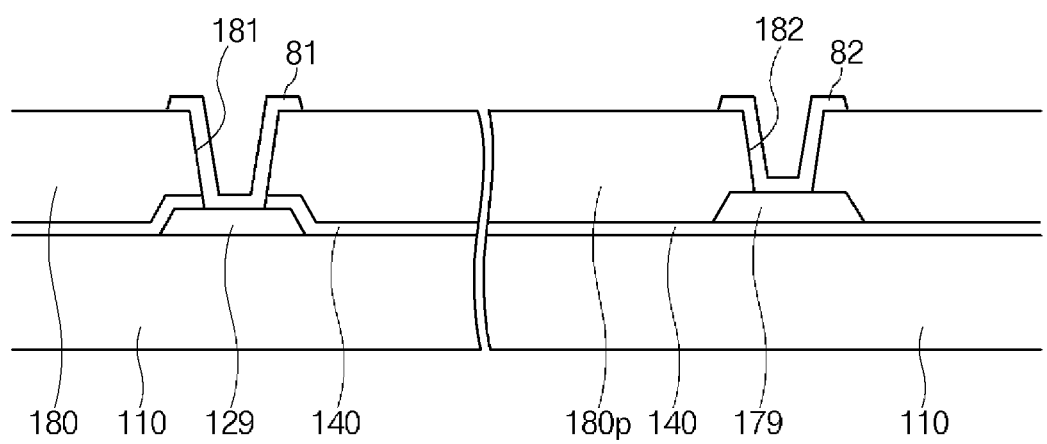

FIG. 7 is a layout diagram of the OLED display according to another embodiment of the present invention. FIGS. 8, 9, and 10 are cross-sectional views of the OLED display shown in FIG. 7, which are taken along lines VIII-VIII, IX-IX, and X-X, respectively.

Referring to FIG. 7, the OLED display according to the present exemplary embodiment may include one pixel comprising first, second, third, and fourth sub-pixels PXa, PXb, PXc, and PXd arranged in 2×2 matrix form.

A plurality of gate lines 121 including a first control electrode 124a, and a plurality of gate conductors including a plurality of second control electrodes 124b, may be formed on an insulating substrate 110 that is made of transparent glass, plastic, or the like.

Each of the gate lines 121 may include upper and lower gate lines 121a and 121b and may largely extend in a longitudinal direction. The upper and lower gate lines 121a and 121b may be disposed on upper and lower sides with the first to fourth sub-pixels PXa, PXb, PXc, and PXd there between. The gate line 121 may include an end portion 129 having wide area for connection to other layers or an external driving circuit. The first control electrode 124a may extend to the upper side or lower side of the gate line 121.

The second control electrode 124b may be spaced apart from the gate line 121. The second control electrode 124b may extend in a row direction, change direction to a column direction, and then extend in the column direction.

A gate-insulating layer 140 may be formed on the gate conductors 121 and 124b.

A plurality of first and second semiconductor islands 154a and 154b may be formed on the gate-insulating layer 140. The first and second semiconductor islands 154a and 154b may be disposed on the first and second control electrodes 124a and 124b, respectively.

A plurality of pairs of first ohmic contact 163a and 165a and a plurality of pairs of second ohmic contacts 163b and 165b may be formed on the first and second semiconductor islands 154a and 154b, respectively. A plurality of data conductors including a plurality of data lines 171, a plurality of driving voltage lines 172, and a plurality of first and second output electrodes 175a and 175b may be formed on the ohmic contacts 163a, 163b, 165a, and 165b and the gate insulating layer 140. Each of the data lines 171 may include first and second data lines 171l and 171r. The data line 171 may largely extend in a longitudinal direction and cross the gate line 121. The first and second data lines 171l and 171r may be disposed on the left and right sides respectively with the first to fourth sub-pixels PXa, PXb, PXc, and PXd there between.

The data line 171 may include an end portion 179 having wide area for connection to a plurality of first input electrodes 173a, which may extend toward the first control electrode 124a, other layers, or an external driving circuit.

Each of the driving voltage lines 172 may include first and second driving voltage lines 172a and 172b. The first driving voltage line 172a may bisect the pixel PX and extend substantially in parallel to the data line 171. The second driving voltage line 172b may bisect the pixel PX and extend substantially in parallel to the gate line 121. The first and second driving voltage lines 172a and 172b may intersect each other. The driving voltage line 172 may include a plurality of second input electrodes 173b extending toward the second control electrode 124b.

The first and second output electrodes 175a and 175b may be separated from each other and may also be separated from the data line 171 and the driving voltage line 172. The first input electrode 173a and the first output electrode 175a may be opposite to each other with respect to the first control electrode 124a, and the second input electrode 173b and the second output electrode 175b may be opposite to each other with respect to the second control electrode 124b.

A passivation layer 180p may be formed on the data conductors 171, 172, 175a, and 175b, the exposed portions of the semiconductors 154a and 154b, and the gate-insulating layer 140.

A plurality of contact holes 182, 185a, 185b, 187, 188a, and 188b for exposing the intersection of the end part 179 of the data line 171, the first and second output electrodes 175a and 175b, the first and second driving voltage lines 172a and 172b, and a portion of the second driving voltage line 172b may be formed in the passivation layer 180p. Furthermore, a plurality of contact holes 181 and 184 for exposing the end part 129 of the gate line 121 and the second input electrode 124b, respectively, may be formed in the passivation layer 180p and the gate insulating layer 140.

A plurality of color filters 230 may be formed on the passivation layer 180p.

The color filters 230 may be formed in through-holes 235, 236, 237, and 238 through which the contact holes 185a, 185b, 187, 188a, and 188b pass. The through-holes 235, 236, 237, and 238 may be larger than the contact holes 185a, 185b, 187, 188a, and 188b. The color filters 230 need not exit in a peripheral region in which the end part 129 of the gate lines 121 and the end part 179 of the data lines 171 are located.

An overcoat 180q may be formed on the color filters 230.

A plurality of pixel electrodes 191, a plurality of first and second connecting members 85 and 87, and a plurality of contact assistants 81 and 82 may be formed on the overcoat 180q.

The pixel electrode 191 may be physically and electrically connected to the second output electrode 175b through the contact hole 185b. The connecting member 85 may be connected to the second control electrode 124b and the first output electrode 175a through the contact holes 184 and 185a.

The second connecting member 87 may be connected to the first and second driving voltage lines 172a and 172b through the contact holes 187, 188a, and 188b.

The contact assistants 81 and 82 may be connected to the end part 129 of the gate line 121 and the end part 179 of the data line 171 through the contact holes 181 and 182, respectively. The contact assistants 81 and 82 may protect and supplement adhesion between the end part 129 of the gate line 121 and the end part 179 of the data line 171, and an external apparatus.

A partition 361 may be formed on the overcoat 180q. The partition 361 may define an opening 365 by surrounding the edge of the pixel electrode 191 like a bank, and may be made of an organic insulator or an inorganic insulator.

An organic light-emitting member 370 may be formed within the opening 365 on the pixel electrode 191 that is defined by the partition 361.

A common electrode 270 may be formed on the organic light-emitting member 370.

As described above, two data lines 171l and 171r may be formed in one pixel including four sub-pixels. Accordingly, the aperture ratio of the OLED display according to an embodiment of the present invention may be increased. For example, four data lines need not go past one pixel including four sub-pixels, but two data lines 171l and 171r may go past one pixel including four sub-pixels. Accordingly, since an area occupied by the data lines in one pixel is reduced, the aperture ratio can be increased.

Furthermore, since the number of the data lines 171l and 171r that go past one pixel is reduced, the number of data driving integrated circuits can be reduced. Accordingly, manufacturing costs may be saved. Although the number of gate driving integrated circuits may be increased, this may not increase overall manufacturing costs because the manufacturing cost of the gate driving integrated circuits may be cheaper than that of the data driving integrated circuits.

Furthermore, since the number of data lines 171l and 171r going past one pixel may be reduced, a frequency in which a short circuit problem may occur between the data lines and the driving voltage lines is minimized. Accordingly, production yield may be improved.

Furthermore, if the first driving voltage line 172a is disposed in a longitudinal direction and the second driving voltage line 172b is disposed in a traverse direction in one pixel, the driving voltage can be applied both in the traverse and longitudinal directions while minimizing a reduction in the aperture ratio. Accordingly, even if the area of a display device is increased, irregularity of the screen display, which may occur because of a voltage drop depending on the load, can be, at least in part, corrected.

It is to be noted that many characteristics of the OLED displays shown in FIGS. 3 to 5 may also be applied to the OLED display shown in FIGS. 7 to 10.

Figure 11:
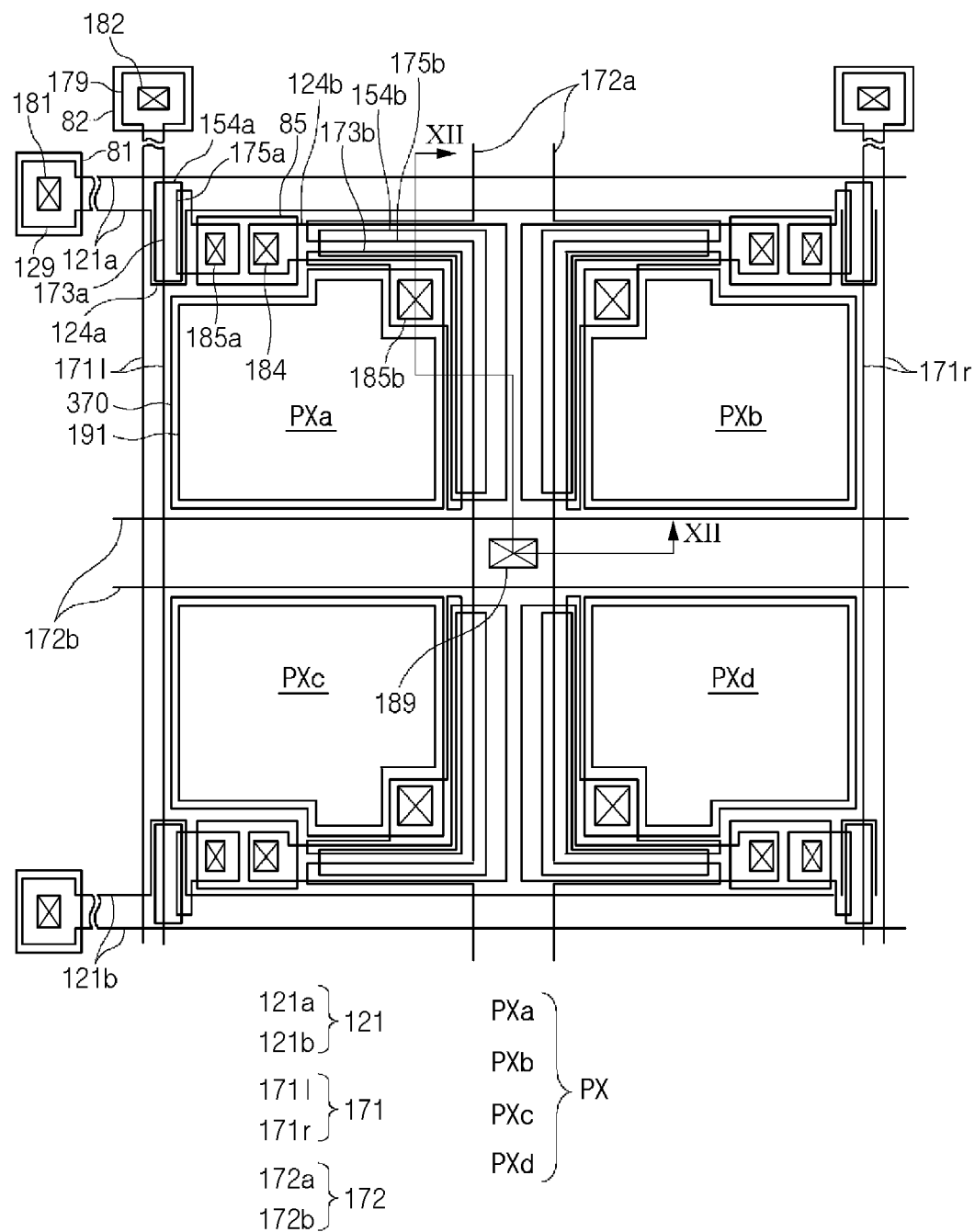
FIG. 11 is a layout diagram of an OLED display according to still another embodiment of the present invention.
Figure 12:
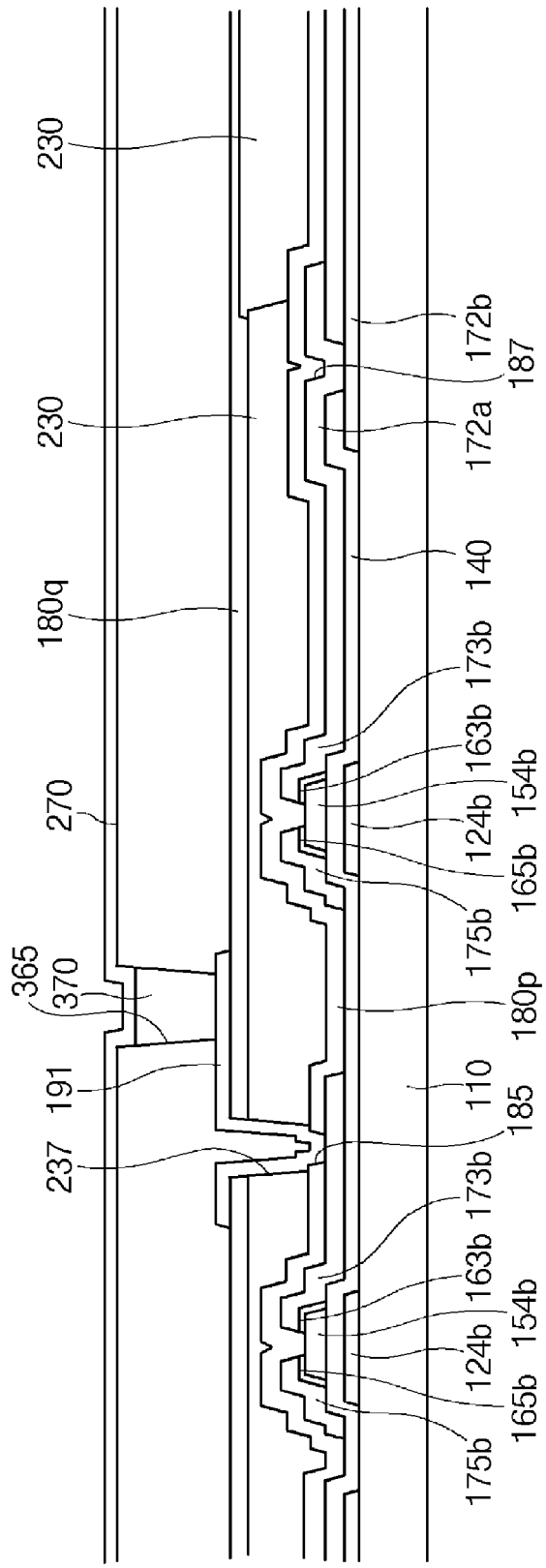
FIG. 12 is a cross-sectional view of the OLED display of FIG. 11, which is taken along line XII-XII.

FIG. 11 is a layout diagram of the OLED display according to still another embodiment of the present invention. FIG. 12 is a cross-sectional view of the OLED display of FIG. 11, which is taken along line XII-XII.

Referring to FIGS. 11 and 12, the OLED display according to one exemplary embodiment may include a plurality of gate lines 121 having a first control electrode 124a and a plurality of the gate conductors having a second control electrode 124b, which may be formed on an insulating substrate 110. Each of the gate lines 121 may include a control electrode 124a and 124b and an end portion 129. A gate-insulating layer 140 may be formed on the gate conductor 121. First and second semiconductor islands 154a and 154b may be formed on the gate insulating layer 140, and a plurality of ohmic contacts 163b and 165b may be formed on the first and second semiconductor islands 154a and 154b. Data conductors including a plurality of data lines 171, a plurality of first and second output electrodes 175a and 175b respectively, and a driving voltage line 172 may be formed on the ohmic contacts 163b and 165b and the gate insulating layer 140. Each of the data lines 171 may include a plurality of input electrodes 173a and 173b, and an end portion 179. A passivation layer 180p may be formed on the data conductors 171 and 175, and a plurality of contact holes 181, 182, 184, and 185a and 185b may be formed in the passivation layer 180p and the gate-insulating layer 140. A plurality of color filters 230 may be formed on the passivation layer 180p, and an overcoat 180q may be formed on the color filters 230. Through-holes 237 through which the contact holes 184 and 185a and 185b may pass may be formed in the color filter 230. A plurality of pixel electrodes 191, a plurality of connecting members 85, and a plurality of contact assistants 81 and 82 may be formed on the overcoat 180q.

In the OLED display according to the present exemplary embodiment, the first driving voltage line 172a and the second driving voltage line 172b may be directly connected to each other. For example, a contact hole 189 through which the second driving voltage line 172b is exposed may be formed in the gate-insulating layer 140. The first driving voltage line 172a and the second driving voltage line 172b may be connected to each other through the contact hole 189.

According to an embodiment of the present invention, by applying the driving voltage of the OLED display up and down and right and left, the occurrence of a voltage drop can be reduced or prevented. Accordingly, the irregularity of the screen can be minimized or eliminated.

It is to be noted that many characteristics of the OLED displays shown in FIGS. 3 to 5 may also be applied to the OLED display shown in FIGS. 11 and 12.

An OLED display according to still another embodiment of the present invention will now be described in detail with reference to FIGS. 13 to 16.

Figure 13:
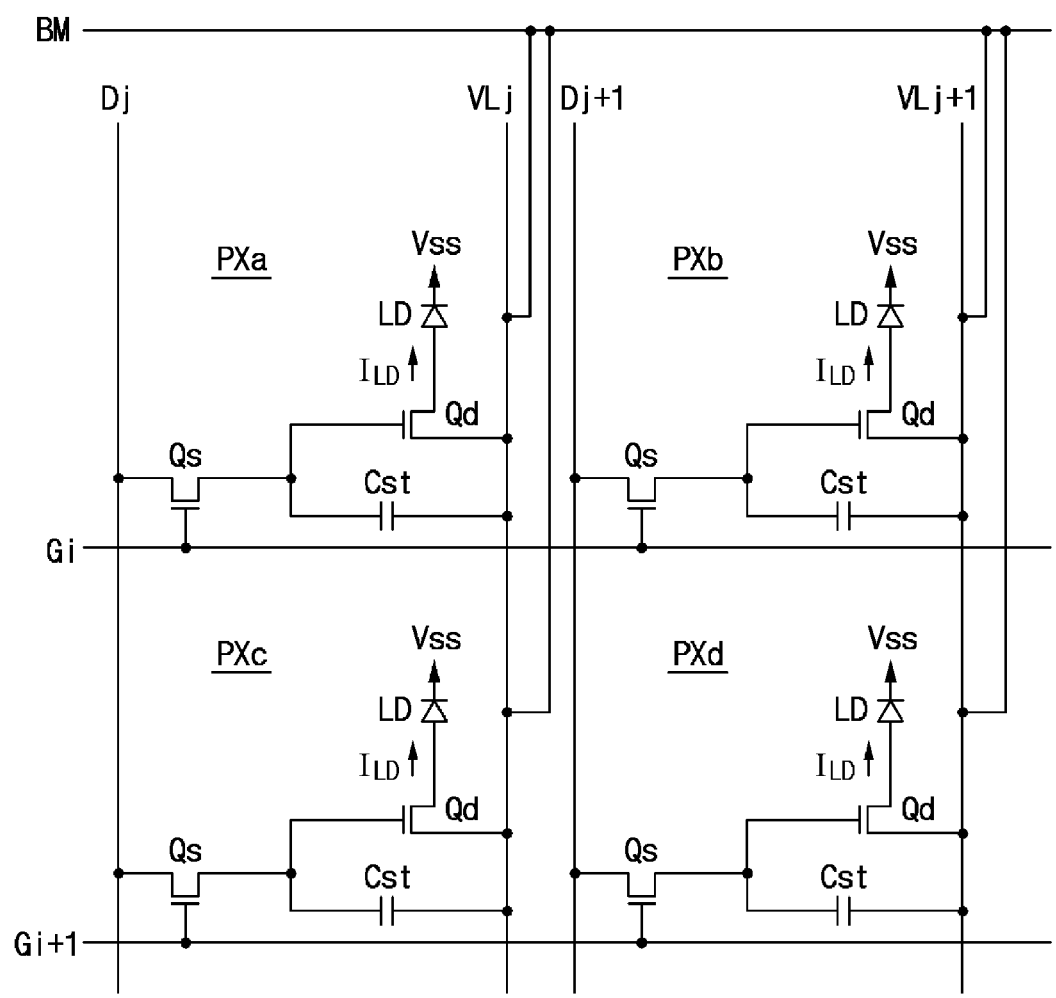
FIG. 13 is an equivalent circuit of an OLED display according to still another embodiment of the present invention.

FIG. 13 is an equivalent circuit of an OLED display according to still another embodiment of the present invention.

Referring to FIG. 13, each pixel PX may include a plurality of sub-pixels PXa, PXb, PXc, and Pxd arranged in a matrix form. Each of the respective sub-pixels PXa, PXb, PXc, and PXd may display any one of red, green, blue, and white. The sub-pixels PXa, PXb, PXc, and PXd are arranged in 2×2 matrix form, thus forming one pixel PX.

The OLED display according to the present exemplary embodiment may include upper and lower scanning signal lines $G_i$ and $G_{i+1}$ respectively, left and right data lines $D_j$ and $D_{j+1}$ respectively, left and right driving voltage lines $VL_j$ and $VL_{j+1}$ respectively, and a light-blocking member BM. The scanning signal lines $G_i$ and $G_{i+1}$ may extend approximately in a row direction and may be parallel to each other. The data lines $D_j$ and $D_{j+1}$ may extend approximately in a column direction and may be parallel to each other. The driving voltage lines $VL_j$ and $VL_{j+1}$, may be parallel to the data lines $D_j$ and $D_{j+1}$ and may be parallel to each other. The light-blocking member BM may be connected to the driving voltage lines $VL_j$ and $VL_{j+1}$.

The upper scanning signal line $G_i$ may transmit a gate signal to the first and second sub-pixels PXa and PXb, and the lower scanning signal line $G_{i+1}$ may transmit the gate signal to the third and fourth sub-pixels PXc and PXd. The left data line $D_j$ may transmit a data signal to the first and third sub-pixels PXa and PXc, and the right data line $D_{j+1}$ may transmit the data signal to the second and fourth sub-pixels PXb and PXd. The driving voltage line $VL_j$ and $VL_{j+1}$ and the light-blocking member BM may transmit a driving voltage to the first to fourth sub-pixels PXa, PXb, PXc, and PXd.

Each of the sub-pixels PXa, PXb, PXc, and PXd, for example the sub-pixel PXa connected to the scanning signal line $G_i$ and the data line $D_j$, may include an OLED LD, a driving transistor Qd, a storage capacitor Cst, and a switching transistor Qs.

The OLED LD, the driving transistor Qd, the storage capacitor Cst, and the switching transistor Qs may be the same as those that have been described above. Accordingly, they will not be described in detail.

An example of the OLED display shown in FIG. 13 will be described in detail below with reference to FIGS. 14 to 16.

Figure 14:
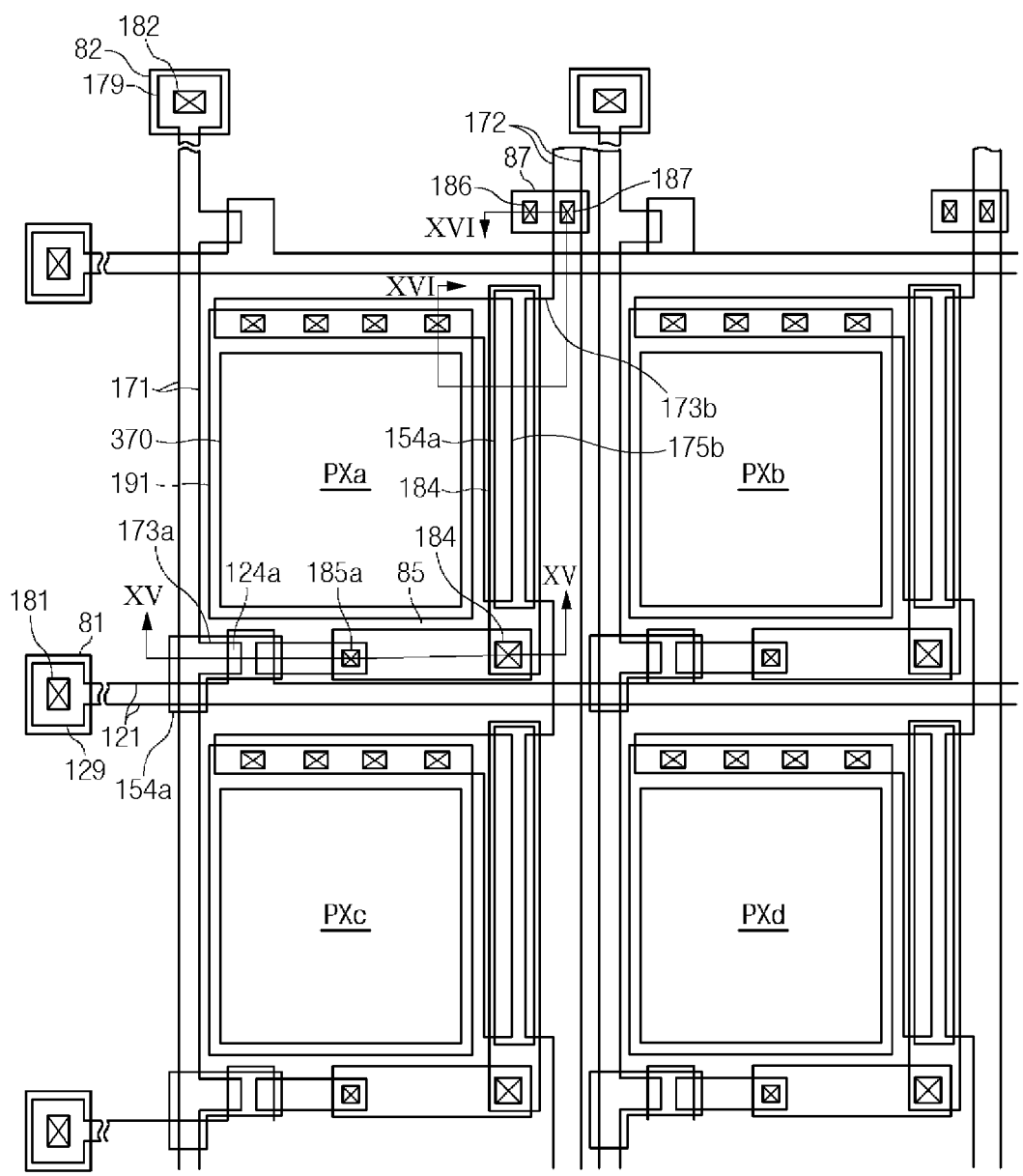
FIG. 14 is a layout diagram of an OLED display according to still another embodiment of the present invention.

FIG. 14 is a layout diagram of the OLED display according to still another embodiment of the present invention. FIGS. 15 and 16 are cross-sectional views of the OLED display shown in FIG. 14, which are taken along lines XV-XV and XVI-XVI, respectively.

Referring to FIG. 14, the OLED display according to an exemplary embodiment may include one pixel comprising first, second, third, and fourth sub-pixels PXa, PXb, PXc, and PXd, respectively arranged in 2×2 matrix form.

A light-blocking member 220 may be formed on the insulating substrate 110. The insulating substrate 110 may be made of transparent glass, plastic, or the like. The light-blocking member 220 may primarily include traverse lines extending largely in a traverse direction and longitudinal lines extending in a longitudinal direction, and an opening in which the traverse and the longitudinal lines are defined. The light-blocking member 220 may be made of metal and may transmit the driving voltage.

The lateral sides of the light-blocking member 220 may be inclined relative to a surface of the substrate 110, and the inclination angle thereof may be within the range of about 30-80 degrees.

An insulating layer 221 may be formed on the light-blocking member 220. The insulating layer 221 may be made of a metal oxide.

A plurality of gate lines 121 including a first control electrode 124a, and a plurality of gate conductors including a plurality of second control electrodes 124b may be formed on the insulating layer 221.

The gate line 121 may mainly extend in a horizontal direction. Each gate line 121 may include an end portion 129 having a wide area for connection to other layers or an external driving circuit. The first control electrode 124a may extend to the upper side and the lower side of the gate line 121. The second control electrode 124b may be separated from the gate line 121, and it may extend in a row direction, change direction to a column direction, and then extend in the column direction.

A gate-insulating layer 140 may be formed on the gate conductors 121 and 124b.

A plurality of first and second semiconductor islands 154a and 154b may be formed on the gate-insulating layer 140. The first and second semiconductor islands 154a and 154b may be positioned on the first and second control electrodes 124a and 124b, respectively.

A plurality of pairs of first ohmic contacts 163a and 165a and a plurality of pairs of second ohmic contacts 163b and 165b may be formed on the first and second semiconductors 154a and 154b, respectively.

A plurality of data conductors including a plurality of data lines 171, a plurality of driving voltage lines 172, and a plurality of first and second output electrodes 175a and 175b may be formed on the ohmic contacts 163a, 163b, 165a, and 165b and the gate insulating layer 140.

The data line 171 may primarily extend in a vertical direction to intersect the gate line 121. Each data line 171 may include an end portion 179 having wide area for connecting a plurality of the first input electrodes 173a that are extended toward the first control electrode 124a to other layers or an external driving circuit.

The driving voltage line 172 may extend substantially in parallel to the data line 171. Each driving voltage line 172 may include a plurality of second input electrodes 173b that may be extended toward the second control electrode 124b.

The first and second output electrodes 175a and 175b may be separated from each other and may also be separated from the data line 171 and the driving voltage line 172. The first input electrode 173a and the first output electrode 175a may be opposite to each other about the first control electrode 124a The second input electrode 173b and the second output electrode 175b may be opposite to each other about the second control electrode 124b.

A passivation layer 180p may be formed on the data conductors 171, 172, 175a, and 175b, the exposed portion of the semiconductor islands 154a and 154b, and the gate-insulating layer 140.

A plurality of contact holes 182, 185a, 185b, and 187 for exposing each of the end part 179 of the data line 171, the first and second output electrodes 175a and 175b, and a portion of the driving voltage line 172 may be formed in the passivation layer 180p. Furthermore, a plurality of contact holes 181 and 184 for exposing each of the end part 129 of the gate line 121 and the second input electrode 124b may be formed in the passivation layer 180p and the gate insulating layer 140. Furthermore, a contact hole 186 for exposing a portion of the light-blocking member 220 may be formed in the passivation layer 180p, the gate-insulating layer 140, and the insulating layer 221.

A plurality of color filters 230a and 230b may be formed on the passivation layer 180p.

Through-holes 235, 236, 237, 238, and 239 through which the contact holes 184, 185a, 185b, 186, and 187 pass may be formed in the color filter 230. The through-holes 235, 236, 237, 238, and 239 may be larger than the contact holes 184, 185a, 185b, 186, and 187. The color filters 230 need not exist in a peripheral region in which the end part 129 of the gate line 121 and the end part 179 of the data line 171 are located.

Each of the color filters 230 may display any one of the three additive primary colors red, green, and blue. For example, a color filter for displaying red may be included in a red pixel, a color filter for displaying green may be included in a green pixel, and a color filter for displaying blue may be included in a blue pixel.

A color filter need not included in a white pixel.

An overcoat 180q may be formed on the color filters 230.

A plurality of pixel electrodes 191, a plurality of first and second connecting members 85 and 87, and a plurality of contact assistants 81 and 82 may be formed on the overcoat 180q. They may be made of a transparent conductive material such as ITO or IZO, or a reflective metal such as aluminum, silver, and alloys thereof.

The pixel electrode 191 may be physically and electrically connected to the second output electrode 175b through the contact hole 185b. The connecting member 85 may be connected to the second control electrode 124b and the first output electrode 175a through the contact holes 184 and 185a.

The second connecting member 87 may be connected to the driving voltage line 172 and the light-blocking member 220 through the contact holes 186 and 187. Therefore, the driving voltage applied to the light-blocking member 220 may be transmitted to the pixel PX through the driving voltage line 172. Accordingly, since an application path of the driving voltage may be widened, it may not be necessary to control wiring resistance, line width, thickness, and other such properties of the driving voltage line 172. Consequently, the aperture ratio can be secured while sufficiently transmitting the driving voltage.

The contact assistants 81 and 82 may be connected to the end part 129 of the gate line 121 and the end part 179 of the data line 171 through the contact holes 181 and 182, respectively. The contact assistants 81 and 82 may protect and supplement adhesion between the end part 129 of the gate line 121, the end part 179 of the data line 171, and an external apparatus.

A partition 361 may be formed on the overcoat 180q. The partition 361 may define an opening 365 by surrounding the edge of the pixel electrode 191 like a bank, and is made of an organic insulator or an inorganic insulator.

An organic light-emitting member 370 may be formed within the opening 365 on the pixel electrode 191 that is defined by the partition 361.

Meanwhile, the light-blocking member 220 may be formed in a portion in which the organic light-emitting member 370 is not present. For example, the light-blocking member 220 may be extended in a traverse direction and a longitudinal direction. The light-blocking member 220 may serve to block light.

A common electrode 270 may be formed on the organic light-emitting member 370.

According to an embodiment of the present invention, a sufficient driving voltage can be transmitted without the loss of the aperture ratio of the OLED display.

Figure 15:
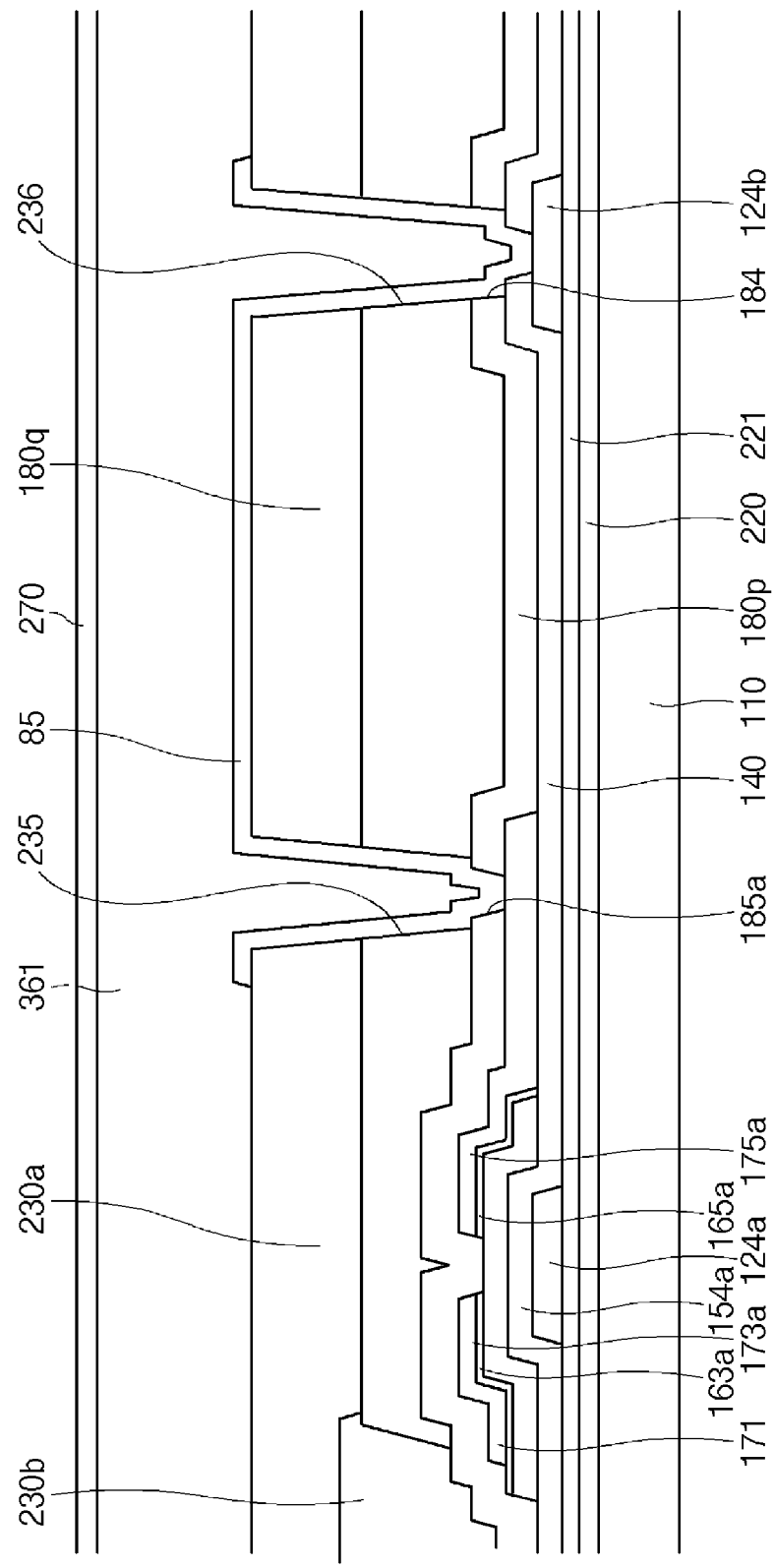
FIGS. 15 and 16 are cross-sectional views of the OLED display shown in FIG. 14, which are taken along lines XV-XV and XVI-XVI, respectively.
Figure 16:
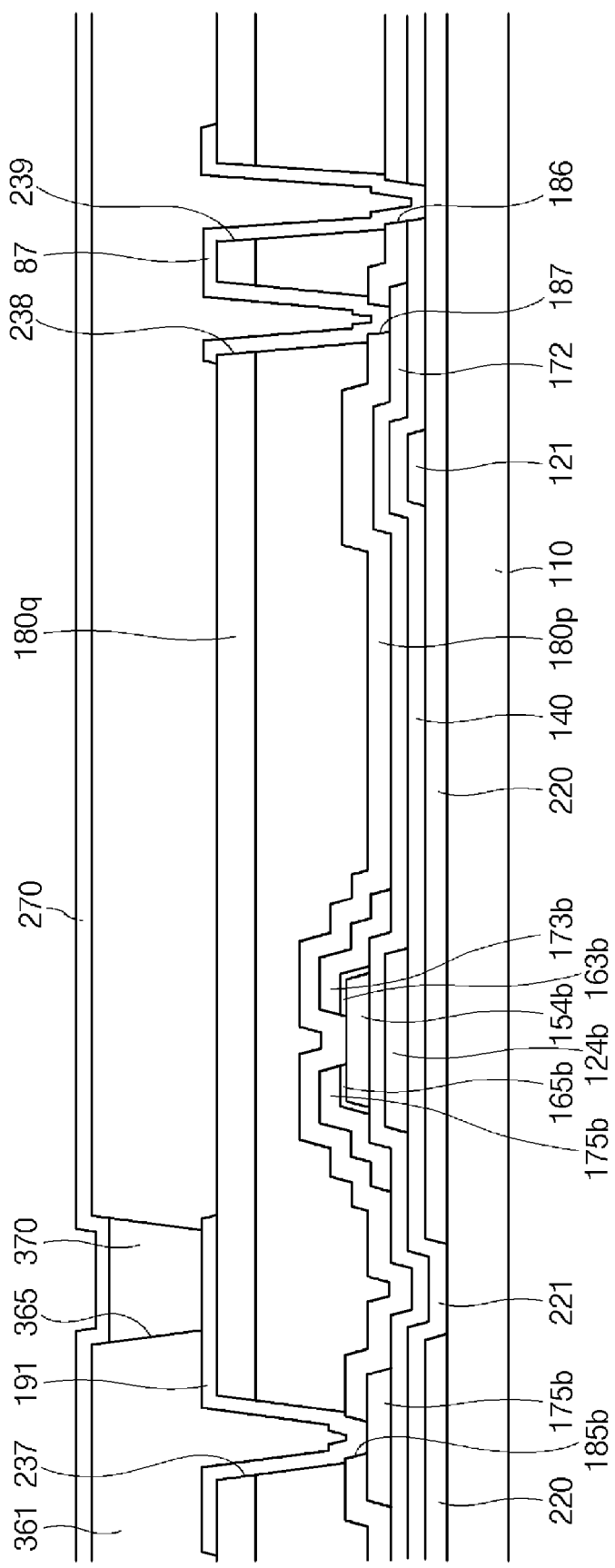

It is to be noted that many characteristics of the OLED displays shown in FIGS. 3 to 5 may also be applied to the OLED display shown in FIGS. 14 to 16.

The above specific embodiments are illustrative, and many variations can be introduced on these embodiments without departing from the spirit of the disclosure or from the scope of the appended claims. For example, elements and/or features of different illustrative embodiments may be combined with each other and/or substituted for each other within the scope of this disclosure and appended claims.

What is claimed is:

1. An organic light emitting diode (OLED) display, comprising:
    a pixel comprising four sub-pixels each displaying a different color;
    two gate lines transmitting gate signals to the pixel and having first control electrodes extended from the two gate lines;
    a second control electrodes separated from the two gate lines;
    a semiconductor at least partially overlapping the second control electrode;
    two data lines transmitting data signals to the pixel; and
    a driving voltage line transmitting a driving voltage to the pixel,
    wherein the driving voltage line includes a first portion extending substantially parallel to the two data lines,
    wherein the semiconductor comprises a portion at least partially overlapping the first portion of the driving voltage line, and
    wherein the first portion of the driving voltage is divided into a left side that corresponds to two left sub-pixels of the four sub-pixels and a right side that corresponds to two right sub-pixels of the four sub-pixels and that a portion of the semiconductor that corresponds to the two left sub-pixels overlaps a portion of the left side of the first portion of the driving voltage line and does not overlap the right side of the first portion of the driving voltage line.

2. The OLED display of claim 1, wherein the four sub-pixels display red, green, blue, and white, respectively; and the sub-pixels are arranged in a matrix of 2 rows and 2 columns.

3. The OLED display of claim 2, wherein one of the two gate lines transmits the gate signal to sub-pixels of a first row of the matrix, and the other of the two gate lines transmits the gate signal to sub-pixels of a second row of the matrix.

4. The OLED display of claim 3, wherein the gate signals transmitted by the two gate lines are the same signal.

5. The OLED display of claim 2, wherein one of the two gate lines is formed in a lower side of sub-pixels of a first row of the matrix and the other of the two gate lines is formed in a lower side of sub-pixels of a second row of the matrix.

6. The OLED display of claim 2, wherein one of the two data lines transmits the data signal to sub-pixels of a first column of the matrix, and the other of the two data lines transmits the data signal to sub-pixels of a second column of the matrix.

7. The OLED display of claim 2, wherein one of the two data lines is disposed in a left side of sub-pixels of a first column of the matrix, and the other of the two data lines is disposed in a right side of sub-pixels of a second column of the matrix.

8. The OLED display of claim 2, wherein the driving voltage line is disposed between sub-pixels of a first column of the matrix and sub-pixels of a second column of the matrix.

9. The OLED display of claim 2, wherein the four sub-pixels displaying red, green, and blue, respectively, include a red color filter, a green color filter, and a blue color filter, respectively.

10. The OLED display of claim 9, wherein the pixel further comprises:

a pixel electrode connected to one or more of the two gate lines and to one or more of the two data lines;

a common electrode opposite to the pixel electrode; and a light-emitting member disposed between the pixel electrode and the common electrode, wherein the light-emitting member comprises a plurality of light emitting layers that emit light having different wavelengths, and the emitted light having different wavelengths is combined to emit white light.

11. The OLED display of claim 10, wherein the red color filter, the green color filter, and the blue color filter are respectively spaced apart from the light-emitting member with the pixel electrode interposed there between.

12. The OLED display of claim 1, wherein the second control electrode overlaps a portion of the driving voltage line.

13. An OLED display, comprising:
   a pixel comprising a first sub-pixel, a second sub-pixel, a third sub-pixel, and a fourth sub-pixel, each of which displays a different color;
   a gate line transmitting gate signals to the pixel, the gate line including a first control electrode;
   a second control electrode separate from the gate line;
   a semiconductor at least partially overlapping the second control electrode;
   a data line transmitting data signals to the pixel;
   a first driving voltage line that transmits a driving voltage to the pixel and includes a first portion extending substantially parallel to the data line; and
   a second driving voltage line that is connected to the first driving voltage line and is substantially parallel to the gate line, wherein the second driving voltage line crosses the center of the pixel,
   wherein the semiconductor comprises a portion at least partially overlapping the first portion of the first driving voltage line, and
   wherein the first portion of the driving voltage is divided into a left side that corresponds to two left sub-pixels of the four sub-pixels and a right side that corresponds to two right sub-pixels of the four sub-pixels and that a portion of the semiconductor that corresponds to the two left sub-pixels overlaps a portion of the left side of the first portion of the driving voltage line and does not overlap the right side of the first portion of the driving voltage line.

14. The OLED display of claim 13, wherein the first driving voltage line and the data line are each comprised of at least one common material.

15. The OLED display of claim 13, wherein the second driving voltage line and the gate line are each comprised of at least one common material.

16. The OLED display of claim 13, wherein the first driving voltage line and the second driving voltage line are connected directly through a contact hole.

17. The OLED display of claim 13, wherein the first driving voltage line and the second driving voltage line are connected through a connecting member.

18. The OLED display of claim 17, wherein the connecting member comprises ITO or IZO.

19. The OLED display of claim 13, wherein the first driving voltage line crosses the center of the pixel.

20. The OLED display of claim 13, wherein the first sub-pixel, second sub-pixel, third sub-pixel, and fourth sub-pixel display red, green, blue, and white, respectively.

21. The OLED display of claim 20, wherein the first sub-pixel, second sub-pixel, and third sub-pixel comprise a red color filter, a green color filter, and a blue color filter, respectively.

22. The OLED display of claim 21, wherein the pixel further comprises:
   a pixel electrode connected to the gate line and the data line;
   a common electrode opposite to the pixel electrode; and
   a light-emitting member disposed between the pixel electrode and the common electrode, wherein the light emitting member comprises a plurality of light emitting layers that each emit light having a different wavelength, and the emitted lights having a different wavelength are combined to emit white light.

23. The OLED display of claim 22, wherein the red color filter, the green color filter, and the blue color filter are respectively spaced apart from the light-emitting member with the pixel electrode interposed there between.

24. The OLED display of claim 19, wherein the first sub-pixel and the second sub-pixel are symmetrical to each other with respect to the first driving voltage line, and the third sub-pixel and the fourth sub-pixel are symmetrical to each other with respect to the first driving voltage line.

25. The OLED display of claim 13, wherein the first sub-pixel and the third sub-pixel are symmetrical to each other with respect to the second driving voltage line, and the second sub-pixel and the fourth sub-pixel are substantially symmetrical to each with respect to the second driving voltage line.

26. The OLED display of claim 13, wherein the gate line comprises:
   a first gate line transmitting a gate voltage to the first sub-pixel and the second sub-pixel; and
   a second gate line transmitting a gate voltage to the third sub-pixel and the fourth sub-pixel.

27. The OLED display of claim 13, wherein the gate line comprises:
   an upper scanning signal line transmitting a gate voltage to the first sub-pixel and the second sub-pixel; and
   a lower scanning signal line transmitting a gate voltage to the third sub-pixel and the fourth sub-pixel.

28. An OLED display in a display apparatus comprising a pixel, the pixel comprising a first sub-pixel, a second sub-pixel, a third sub-pixel, and a fourth sub-pixel, each of which displays a different color, the OLED display comprising:
   a substrate;
   a light-blocking member formed on the substrate and having a plurality of openings;
   a gate line formed on the substrate and transmitting a gate signal to the pixel, the gate line including a first control electrode;
   a second control electrode separate from the gate line;
   a semiconductor at least partially overlapping the second control electrode;
   a data line crossing the gate line and transmitting a data signal to the pixel; and
   a driving voltage line electrically connected to the light-blocking member and transmitting a driving voltage to the pixel,
   wherein the driving voltage line includes a first portion running substantially parallel to the data line and crosses the center of the pixel,
   wherein the semiconductor comprises a portion overlapping at least a portion of the first portion of the driving voltage line, and
   wherein the first portion of the driving voltage is divided into a left side that corresponds to two left sub-pixels of the four sub-pixels and a right side that corresponds to two right sub-pixels of the four sub-pixels and that a portion of the semiconductor that corresponds to the two left sub-pixels overlaps a portion of the left side of the first portion of the driving voltage line and does not overlap the right side of the first portion of the driving voltage line.

29. The OLED display of claim 28, wherein the drive voltage is applied to the light-blocking member.

30. The OLED display of claim 28, wherein the light-blocking member comprises a metal.

31. The OLED display of claim 28, further comprising an organic light emitting member covering one or more of the plurality of openings of the light-blocking member.

32. The OLED display of claim 28, further comprising a first insulating layer formed between the light-blocking member and the gate line.

33. The OLED display of claim 28, wherein the first sub-pixel, the second sub-pixel, the third sub-pixel and the fourth sub-pixel display red, green, blue, and white, respectively.

34. The OLED display of claim 33, wherein the first sub-pixel, the second sub-pixel, and the third sub-pixel include a red color filter, a green color filter, and a blue color filter, respectively.

35. The OLED display of claim 34, wherein the pixel further comprises:
   a pixel electrode connected to the gate line and the data line;
   a common electrode opposite to the pixel electrode; and
   a light-emitting member disposed between the pixel electrode and the common electrode, wherein the light emitting member comprises a plurality of light emitting layers that each emit light having a different wavelength, and the lights having different wavelengths are combined to emit white light.

36. The OLED display of claim 34, wherein the red color filter, the green color filter, and the blue color filter are respectively spaced apart from the light-emitting member with the pixel electrode interposed there between.

37. The OLED display of claim 28 wherein one or more of the plurality of openings is square.

* * * * *